United States Patent
Kikitsu et al.

(10) Patent No.: US 12,228,622 B2
(45) Date of Patent: Feb. 18, 2025

(54) SENSOR WITH MAGNETIC LAYERS AND INSPECTION DEVICE

(71) Applicant: KABUSHIKI KAISHA TOSHIBA, Tokyo (JP)

(72) Inventors: Akira Kikitsu, Yokohama Kanagawa (JP); Yoshihiro Higashi, Komatsu Ishikawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 17/870,371

(22) Filed: Jul. 21, 2022

(65) Prior Publication Data
US 2023/0266411 A1    Aug. 24, 2023

(30) Foreign Application Priority Data
Feb. 21, 2022    (JP) .................................. 2022-024483

(51) Int. Cl.
*G01R 33/09*    (2006.01)
*G01D 5/16*    (2006.01)
(Continued)

(52) U.S. Cl.
CPC .............. *G01R 33/093* (2013.01); *G01D 5/16* (2013.01); *H10N 50/10* (2023.02)

(58) Field of Classification Search
CPC ........................ G01R 33/0017; G01R 33/0023; G01R 33/02; G01R 33/06–098; G01D 5/12; G01D 5/14; G01D 5/16; H10N 50/10
See application file for complete search history.

(56) References Cited

U.S. PATENT DOCUMENTS 6,525,531 B2 *  2/2003  Forrest ................... G01V 3/081
                                                  324/207.2
10,837,953 B2   11/2020  Kikitsu et al.
(Continued)

FOREIGN PATENT DOCUMENTS

JP    2002-277522 A    9/2002
JP    2005-315812 A    11/2005
(Continued)

OTHER PUBLICATIONS

Japan Patent Office, Office Action in JP App. No. 2022-024483, 2 pages, and machine translation, 4 pages (Oct. 25, 2024).

*Primary Examiner* — Huy Q Phan
*Assistant Examiner* — David B Frederiksen
(74) *Attorney, Agent, or Firm* — Finnegan, Henderson, Farabow, Garrett & Dunnner, LLP

(57) ABSTRACT

According to one embodiment, a sensor includes an element portion and a controller. The element portion includes a first element. The first element includes a first magnetic element and a first conductive member. The first magnetic element includes a first magnetic layer and a first opposed magnetic layer. The first conductive member includes a first conductive portion and a first other conductive portion. The controller includes a first circuit. The first circuit is connected to the first conductive portion and the first other conductive portion. The first circuit is configured to supply a first current to the first conductive member. The first current includes an alternating current component. A local minimum value of the first current is of a first polarity, and a local maximum value of the first current is of the first polarity.

18 Claims, 16 Drawing Sheets

(51) Int. Cl.
    *H01L 43/08*         (2006.01)
    *H10N 50/10*        (2023.01)

(56) References Cited

U.S. PATENT DOCUMENTS

| | | | |
|---|---|---|---|
| 2009/0167301 A1* | 7/2009 | Ausserlechner | G01R 33/0035 324/252 |
| 2010/0053820 A1* | 3/2010 | Miyauchi | B82Y 10/00 |
| 2013/0320970 A1* | 12/2013 | Foletto | G01D 5/2448 324/251 |
| 2015/0247884 A1* | 9/2015 | Ogimoto | G01R 33/093 324/252 |
| 2018/0271395 A1 | 9/2018 | Iwasaki et al. | |
| 2019/0041238 A1* | 2/2019 | Ishii | G01D 5/2053 |
| 2019/0369172 A1 | 12/2019 | Kikitsu et al. | |
| 2020/0319269 A1* | 10/2020 | Shirotori | G01R 33/0011 |
| 2022/0065955 A1 | 3/2022 | Kikitsu et al. | |

FOREIGN PATENT DOCUMENTS

| | | |
|---|---|---|
| JP | 2015-197388 A | 11/2015 |
| JP | 2017-3336 A | 1/2017 |
| JP | 2018-155719 A | 10/2018 |
| JP | 2019-207167 A | 12/2019 |
| JP | 6668176 B2 | 3/2020 |
| JP | 2022-37688 A | 3/2022 |

\* cited by examiner

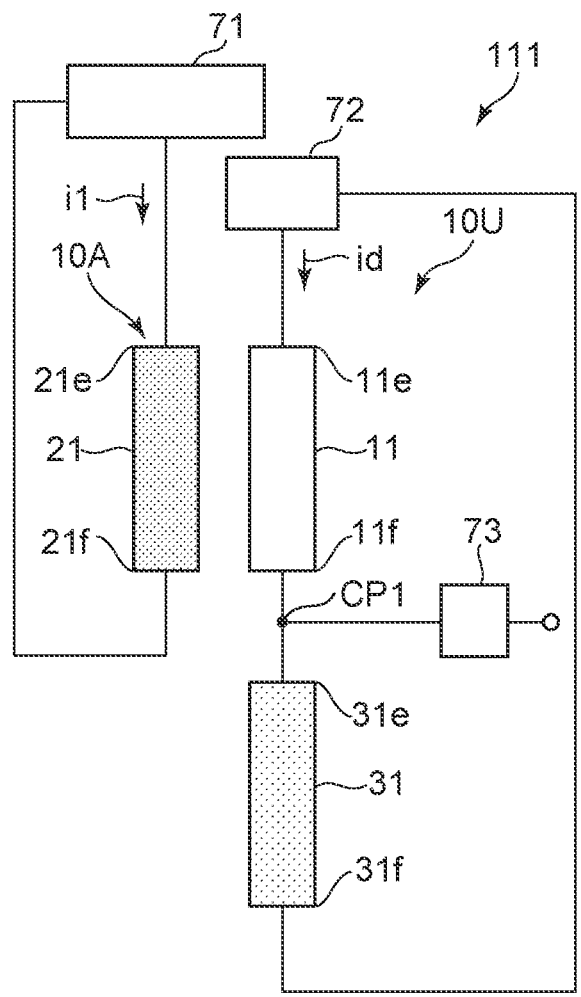
FIG. 7
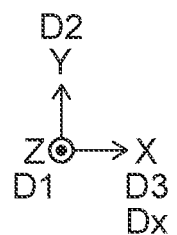

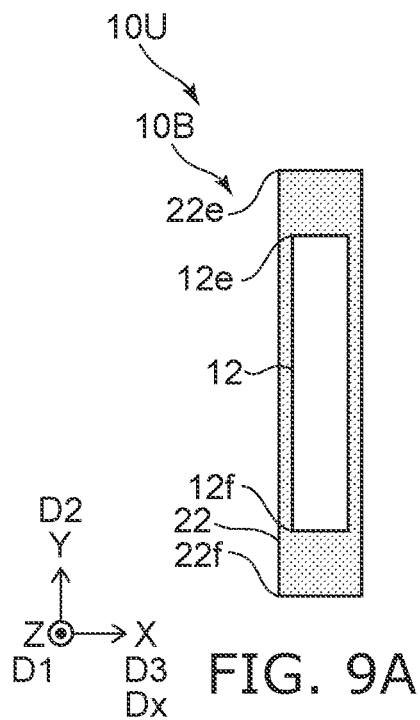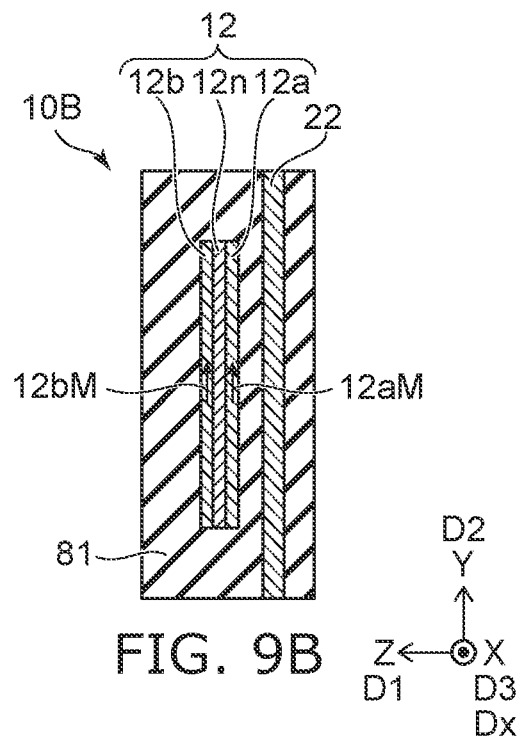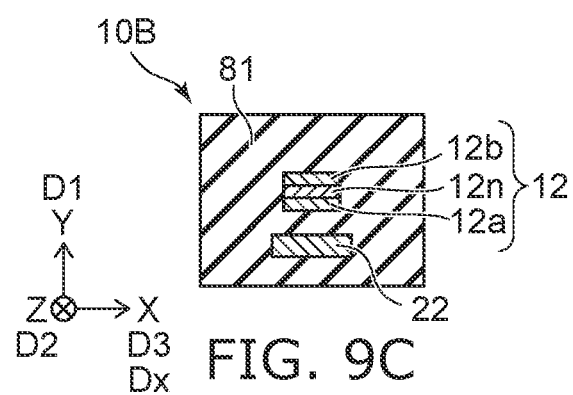

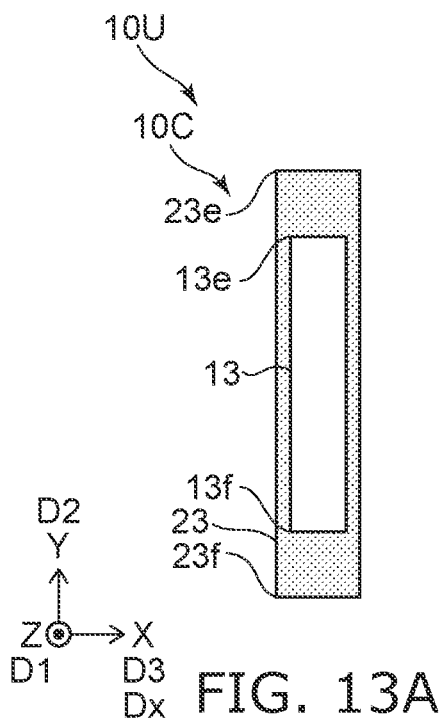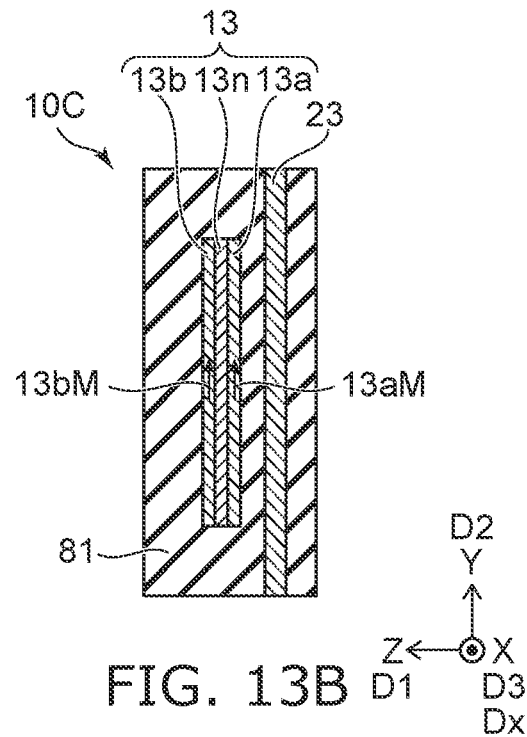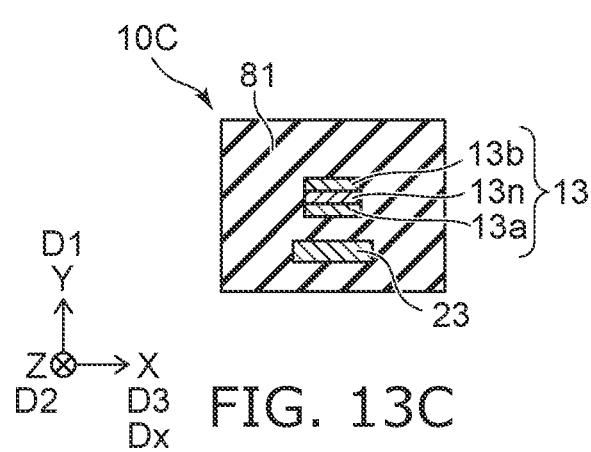

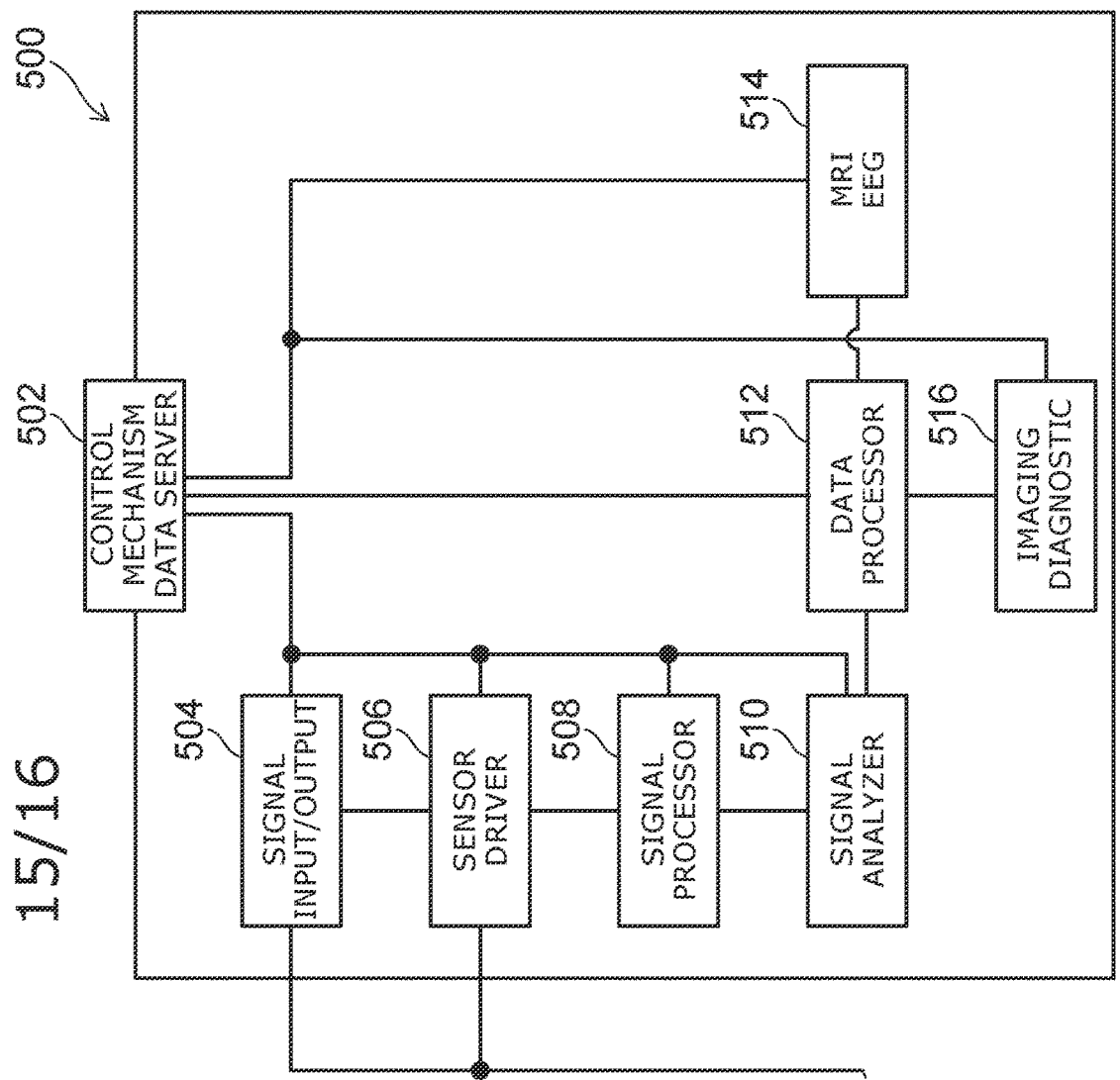
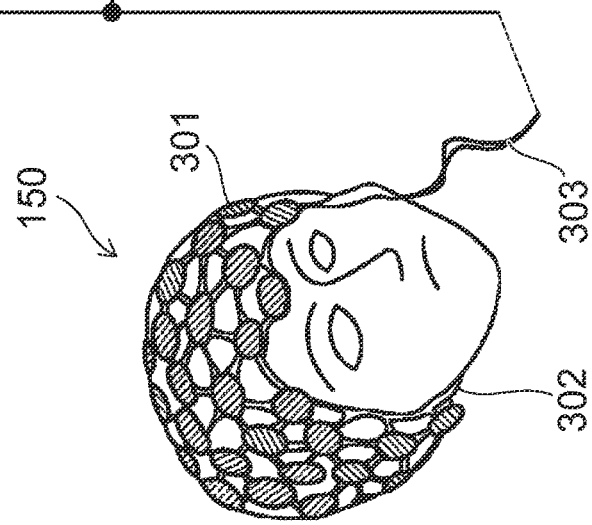
FIG. 18

SENSOR WITH MAGNETIC LAYERS AND INSPECTION DEVICE

CROSS-REFERENCE TO RELATED APPLICATIONS

This application is based upon and claims the benefit of priority from Japanese Patent Application No. 2022-024483, filed on Feb. 21, 2022; the entire contents of which are incorporated herein by reference.

FIELD

Embodiments of the invention generally relate to a sensor and an inspection device.

BACKGROUND

For example, there is a sensor that uses a magnetic layer. It is desired to improve the characteristics of the sensor.

BRIEF DESCRIPTION OF THE DRAWINGS

FIG. 7 is a schematic diagram illustrating the sensor according to the first embodiment:

FIG. 9A to 9C are schematic views illustrating the sensor according to the first embodiment;

FIGS. 13A to 13C are schematic views illustrating the sensor according to the first embodiment;

FIG. 18 is a schematic diagram showing a sensor and an inspection device according to an embodiment.

DETAILED DESCRIPTION

Figure 1A:
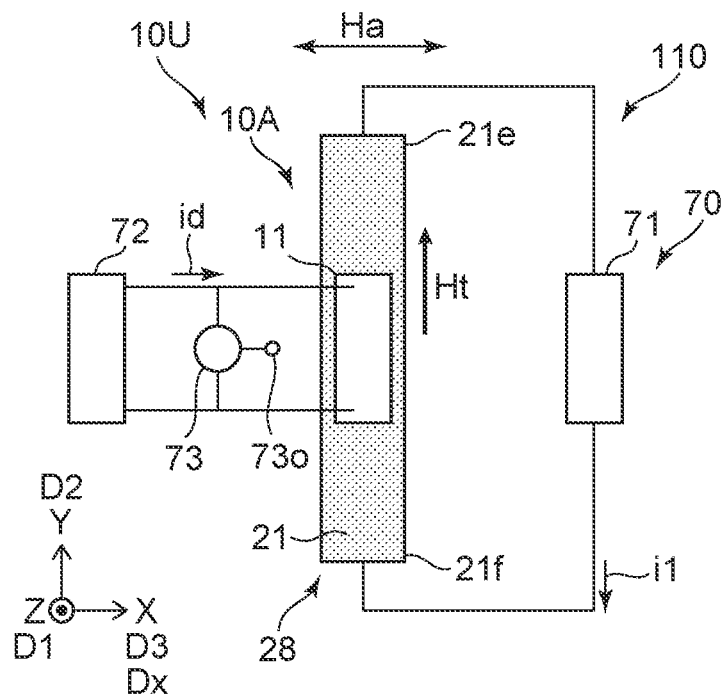
FIGS. 1A to 1C are schematic views illustrating a sensor according to a first embodiment.

According to one embodiment, a sensor includes an element portion and a controller. The element portion includes a first element. The first element includes a first magnetic element and a first conductive member. The first magnetic element includes a first magnetic layer and a first opposed magnetic layer. The first conductive member includes a first conductive portion and a first other conductive portion. A second direction from the first conductive portion to the first other conductive portion crosses a first direction from the first magnetic layer to the first opposed magnetic layer. The controller includes a first circuit. The first circuit is connected to the first conductive portion and the first other conductive portion. The first circuit is configured to supply a first current to the first conductive member. The first current includes an alternating current component. A local minimum value of the first current is of a first polarity, and a local maximum value of the first current is of the first polarity.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1C, and 2A to 2C are schematic views illustrating a sensor according to a first embodiment.

Figure 2A:
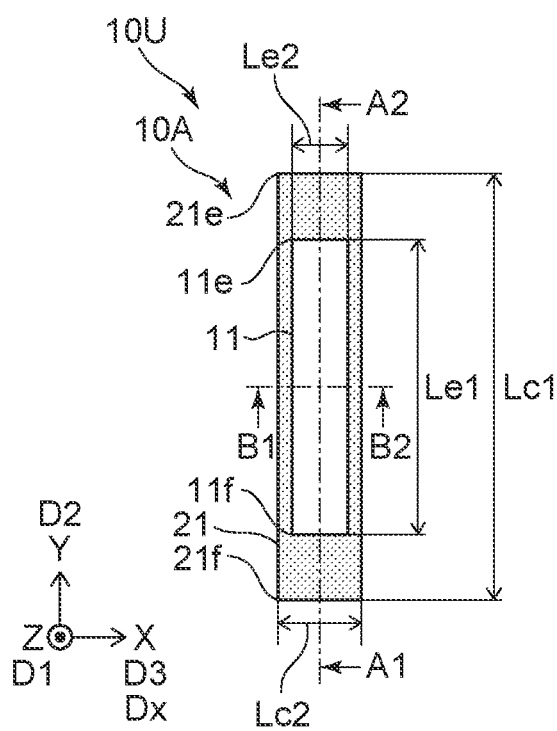
FIGS. 2A to 2C are schematic views illustrating the sensor according to the first embodiment.
Figure 2B:
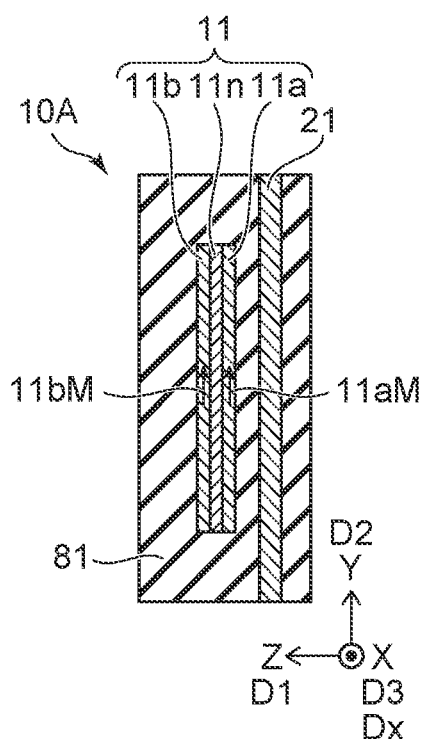
Figure 2C:
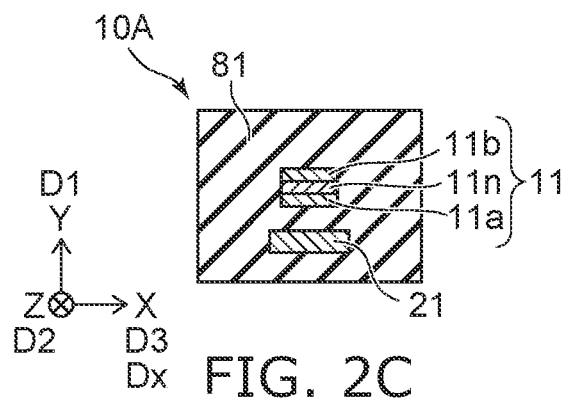

FIG. 2A is a plan view. FIG. 2B is a sectional view taken along line A1-A2 of FIG. 2A. FIG. 2C is a sectional view taken along line B1-B2 of FIG. 2A.

As shown in FIG. 1A, a sensor 110 according to the embodiment includes an element portion 10U and a controller 70. The element portion 10U includes a first element 10A. The sensor 110 is, for example, a magnetic sensor.

The first element 10A includes a first magnetic element 11 and a first conductive member 21.

As shown in FIG. 2B, the first magnetic element 11 includes a first magnetic layer 11a and a first opposed magnetic layer 11b. In this example, the first magnetic element 11 includes a first non-magnetic layer 11n. The first non-magnetic layer 11n is provided between the first magnetic layer 11a and the first opposed magnetic layer 11b.

A first direction D1 from the first magnetic layer 11a to the first opposed magnetic layer 11b is a Z-axis direction. One direction perpendicular to the Z-axis direction is defined as a Y-axis direction. The direction perpendicular to the Z-axis direction and the Y-axis direction is defined as an X-axis direction.

As shown in FIG. 1A, the first conductive member 21 includes a first conductive portion 21e and a first other conductive portion 21f. A second direction D2 from the first conductive portion 21e to the first other conductive portion 21f crosses the first direction D1. The second direction D2 is, for example, the Y-axis direction.

The controller 70 includes a first circuit 71. The first circuit 71 is connected to the first conductive portion 21e and the first other conductive portion 21f. The first circuit 71 is configured to supply the first current i1 to the first conductive member 21.

Figure 1B:
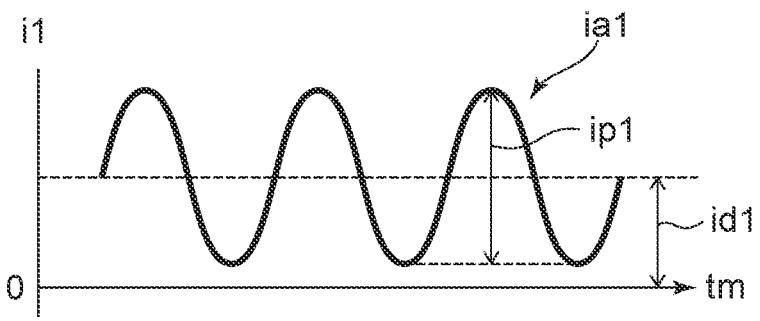

FIG. 1B illustrates the first current i1. The horizontal axis of FIG. 1B is time tm. The vertical axis of FIG. 1B is the value of the first current i1. As shown in FIG. 1B, the first current i1 includes an AC component ia1. The local minimum value of the first current i1 is of a first polarity, and the local maximum value of the first current i1 is of the first polarity. The first polarity is one of positive and negative. Hereinafter, an example in which the first polarity is positive will be described.

For example, the first current i1 includes the AC component ia1 and a DC component id1. The DC component id1 is larger than ½ of an amplitude ip1 of the AC component ia1. In the first current i1, a difference between the local minimum value and the local maximum value corresponds to the amplitude ip1. In embodiments, both the local minimum and the local maximum value are of the first polarity (e.g., positive). The first current i1 does not become a second polarity (for example, negative). The first current i1 never becomes 0.

Figure 1C:
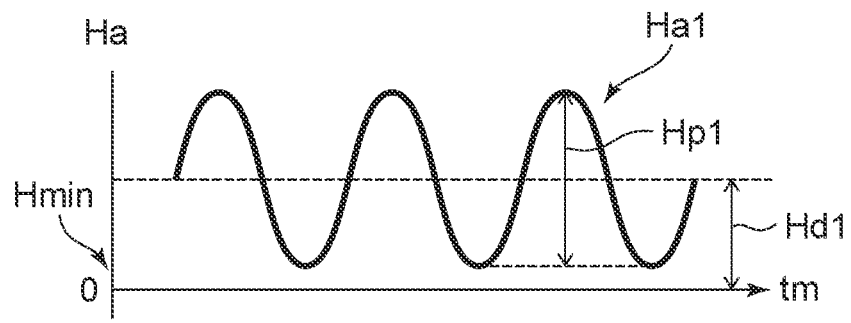

A first magnetic field Ha is generated by the first current i1. The first magnetic field Ha is along a crossing direction Dx. The crossing direction Dx crosses the first direction D1 (the direction from the first magnetic layer 11a to the first opposed magnetic layer 11b). The crossing direction Dx is, for example, the X-axis direction. FIG. 1C illustrates the first magnetic field Ha. The horizontal axis of FIG. 1C is time tm. The vertical axis of FIG. 1C is the intensity of the first magnetic field Ha. As shown in FIG. 1 C, the first magnetic field Ha includes the AC magnetic field component Ha1. The local minimum value of the first magnetic field Ha is of the first polarity, and the local maximum value of the first magnetic field Ha is of the first polarity.

For example, the first magnetic field Ha includes the AC magnetic field component Ha1 and a DC magnetic field component Hd1. The DC magnetic field component Hd1 is larger than ½ of an amplitude Hp1 of the AC magnetic field component Ha1. In the first magnetic field Ha, the difference between the local minimum value and the local maximum value corresponds to the amplitude Hp1. In embodiments, both the local minimum vale and the local maximum value are of the first polarity (e.g., positive). The first magnetic field Ha does not become the second polarity (for example, negative). The first magnetic field Ha never becomes zero. The local minimum value Hmin of the first magnetic field Ha is the difference between the DC magnetic field component Hd1 and the ½ of the amplitude Hp1 of the AC magnetic field component Ha1. In the embodiment, for example, the local minimum value Hmin of the first magnetic field Ha is positive.

In this way, the first current i1 flows through the first conductive member 21, so that the first magnetic field Ha is generated from the first conductive member 21. The first conductive member 21 is one of the examples of the magnetic field generating portion 28. The first magnetic field Ha along the crossing direction Dx is generated from the magnetic field generating portion 28.

The first magnetic field Ha is applied to the first magnetic element 11. A first electric resistance of the first magnetic element 11 changes according to the change of the first magnetic field Ha. The change in the electric resistance is due to, for example, the MR (magnetoresistance effect) effect. For example, the first electric resistance of the first magnetic element 11 changes according to the change of the first current i1.

On the other hand, a detection target magnetic field Ht is applied to the first magnetic element 11. The first electric resistance of the first magnetic element 11 also changes depending on the detection target magnetic field Ht. As described above, the first electric resistance changes depending on both the first current i1 (and the first magnetic field Ha) and the detection target magnetic field Ht. In the embodiment, the change in the first electric resistance is detected, and the detected signal is processed based on the frequency of the AC component ia1 of the first current i1 (the frequency of the AC magnetic field component Ha1 of the first magnetic field Ha). The detection target magnetic field Ht can be detected.

In the embodiment, as described above, both the local minimum value and the local maximum value are of the first polarity (for example, positive). For example, the first current i1 and the first magnetic field Ha are always of the first polarity (positive) and never be 0 or negative. This result in a detection with suppressed noise.

For example, when the first current i1 (and the first magnetic field) changes from positive to 0 or negative, magnetic domain disturbance occurs in at least one of the first magnetic layer 11a or the first opposed magnetic layer 11b. Disturbances in magnetic domains include, for example, formation of magnetic domains, disappearance of magnetic domains, or movement of magnetic domains. Noise is generated in the signal obtained from the first magnetic element 11 due to the disturbance of the magnetic domain. In the embodiment, when the first current i1 and the first magnetic field Ha always have one polarity (for example, positive), noise caused by the disturbance of the magnetic domain can be suppressed. This enables more stable and highly sensitive detection. According to the embodiment, it is possible to provide a sensor and an inspection device with improved sensitivity.

As shown in FIG. 1A, the controller 70 may include a second circuit 72. The second circuit 72 is configured to supply a detection current id to the first magnetic element 11.

As shown in FIG. 1A, the controller 70 may include a third circuit 73. The third circuit 73 is configured to detect a value corresponding to the change in the first electric resistance. For example, the detection current id causes a potential difference according to the first electric resistance. The third circuit 73 detects a signal including a change in the potential difference. A signal corresponding to the detection target magnetic field Ht is obtained from the output portion 73o of the third circuit 73.

As shown in FIG. 2A, a length of the first conductive member 21 in the second direction D2 is defined as a length Lc1. A length of the first conductive member 21 in a third direction D3 is defined as a length Lc2. In embodiments, the length Lc1 is preferably longer than the length Lc2. The third direction D3 crosses a plane including the first direction D1 and the second direction D2. The third direction D3 corresponds to the crossing direction Dx. As a result, the orientation of the generated magnetic field (first magnetic field Ha) becomes more uniform. A ratio of the length Lc1 to the length Lc2 (Lc1/Lc2) is, for example, not less than 2 and not more than 1000.

As shown in FIG. 2A, a length of the first magnetic element 11 in the second direction D2 is defined as a length Le1. A length of the first magnetic element 11 in the third direction D3 is defined as a length Le2. In the embodiment, the length Le1 is preferably longer than the length Le2. This makes the orientation of magnetization of the magnetic layer more stable. This is due to shape anisotropy. A ratio of the length Le1 to the length Le2 (Le1/Le2) is, for example, not less than 2 and not more than 1000.

As shown in FIG. 2B, in this example, when the first current i1 is not flowing, the magnetization 11aM of the first magnetic layer 11a is along the second direction D2. The magnetization 11bM of the first opposed magnetic layer 11b is along the second direction D2. In embodiments, the magnetization 11aM may crosses the magnetization 11bM. In the embodiment, the first magnetic layer 11a may be, for example, one of the reference layer and the magnetization free layer. The first opposed magnetic layer 11b may be, for example, the other of the reference layer and the magnetization free layer.

The change in the first electric resistance of the first magnetic element 11 is based on, for example, the change in the angle between the magnetization 11aM and the magnetization 11bM according to the magnetic field applied to the first magnetic element 11.

As shown in FIGS. 2B and 2C, a direction from the first conductive member 21 to the first magnetic element 11 is along the first direction D1. In this example, the first magnetic layer 11a is located between the first conductive member 21 and the first opposed magnetic layer 11b. In the embodiment, the first opposed magnetic layer 11b may be located between the first conductive member 21 and the first magnetic layer 11a.

In the embodiment, the first non-magnetic layer 11n may be conductive. The first non-magnetic layer 11n includes, for example, Cu and the like. The first magnetic element functions as a GMR (Giant Magneto Resistance effect) element. The first non-magnetic layer 11n may be insulating. The first non-magnetic layer 11n includes, for example, MgO and the like. The first magnetic element functions as a TMR (Tunnel Magneto Resistance effect) element.

As shown in FIGS. 2B and 2C, the first element 10A may include a first insulating member 81. At least a part of the first insulating member 81 is provided between the first magnetic element 11 and the first conductive member 21. The first insulating member 81 electrically insulates between the first magnetic element 11 and the first conductive member 21.

As shown in FIG. 2A, the first magnetic element 11 includes a first element portion 11e and a first other element portion 11f. The first element portion 11e corresponds to the first conductive portion 21e. The first other element portion 11f corresponds to the first other conductive portion 21f. A direction from the first element portion 11e to the first other element portion 11f is along the second direction D2. A distance between the first element portion 11e and the first conductive portion 21e is shorter than a distance between the first element portion 11e and the first other conductive portion 21f. A distance between the first other element portion 11f and the first other conductive portion 21f is shorter than a distance between the first other element portion 11f and the first conductive portion 21e.

In the embodiment, the orientation of magnetization of the magnetic layer is changed by the first magnetic field Ha. As described above, the first magnetic field Ha is along the crossing direction Dx. The detection target magnetic field Ht includes a component in a direction crossing the crossing direction Dx (for example, the second direction D2). The component of the second direction D2 of the detection target magnetic field Ht affects the orientation of magnetization by the first magnetic field Ha. By detecting the change in the first electric resistance based on the orientation of magnetization, the detection target magnetic field Ht can be detected.

For example, when a second direction magnetic field having a component of the second direction D2 is applied to the first magnetic element 11, the change in the first electric resistance is large. On the other hand, when a third-direction magnetic field having a component in the crossing direction Dx (third direction D3 described later) is applied to the first magnetic element 11, the change in the first electric resistance is small. The rate of change of the first electric resistance with respect to the change of the second direction magnetic field is higher than the rate of change of the first electric resistance with respect to the change of the third direction magnetic field.

Figure 3:
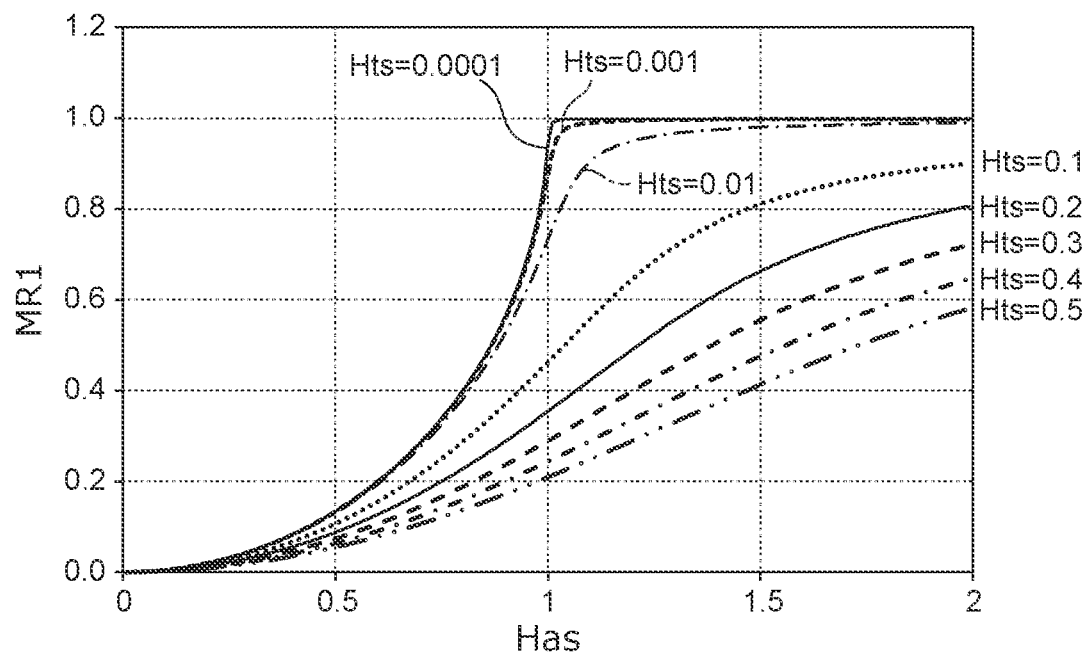
FIG. 3 is a graph illustrating the characteristics of the sensor.
Figure 4:
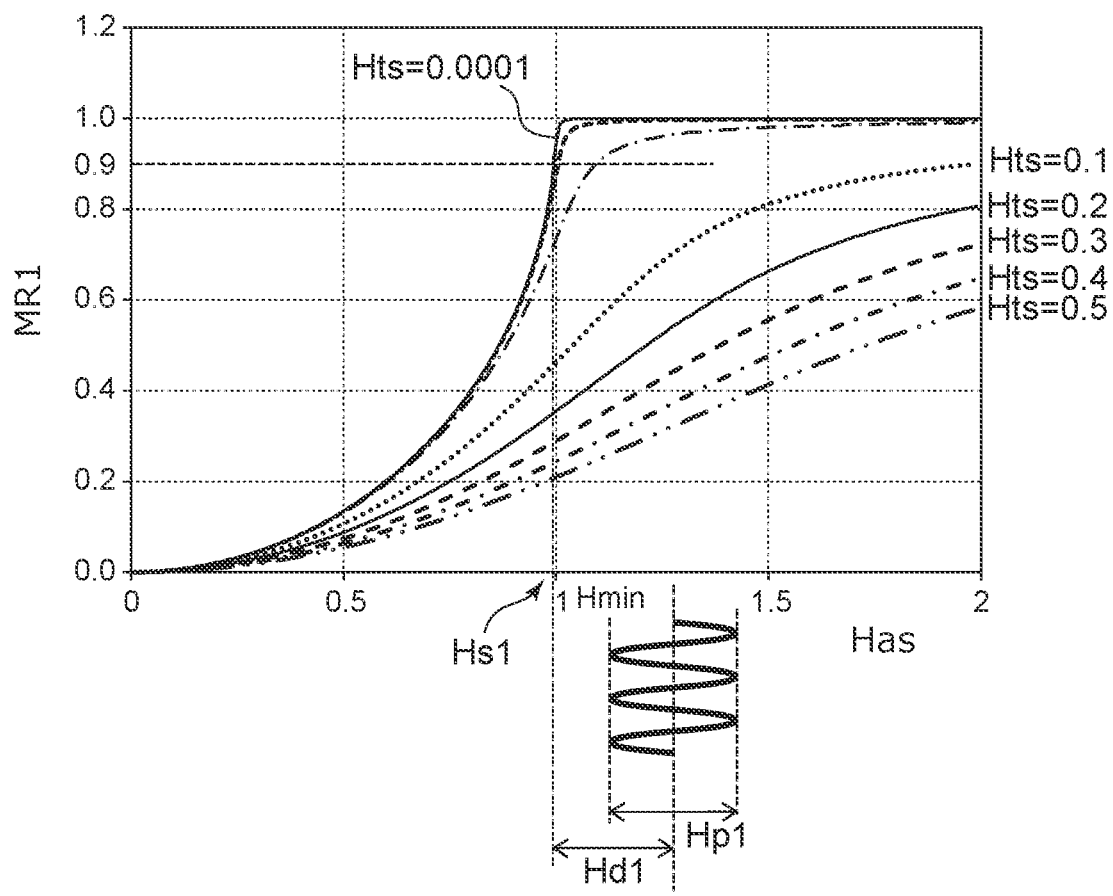
FIG. 4 is a graph illustrating the characteristics of the sensor.

FIGS. 3 and 4 are graphs illustrating the characteristics of the sensor.

FIG. 3 illustrates a simulation result of the characteristics of the sensor 110 according to the embodiment. In the simulation, the first magnetic layer 11a is a magnetization free layer, and the first opposed magnetic layer 11b is a reference layer. The detection target magnetic field Ht along the second direction D2 and the magnetic field along the third direction D3 are applied to the first magnetic element 11. In the simulation, these magnetic fields do not include DC components. The orientation of the magnetization 11aM of the first magnetic layer 11a and the orientation of the magnetization 11bM of the first opposed magnetic layer 11b under the application of these magnetic fields are calculated. Magnetic resistance is calculated based on the angle of the orientation of these magnetizations.

The horizontal axis in FIG. 3 is a magnetic field strength Has of the magnetic field along the third direction D3. The magnetic field strength Has is normalized by the anisotropic magnetic field Hk of the magnetization free layer. The vertical axis of FIG. 3 is a magnetic resistance MR1. The magnetic resistance MR1 is normalized by the maximum value of the magnetic resistance. FIG. 3 shows values at various normalized detection target magnetic fields Hts. The normalized detection target magnetic field Hts is normalized by the anisotropic magnetic field Hk of the magnetization free layer.

In FIG. 3, the magnetic resistance MR1 when the normalized detection target magnetic field Hts is 0.0001 corresponds to the magnetic resistance when the detection target magnetic field Ht is not substantially applied to the first magnetic element 11. At this time, when the magnetic field strength Has of the magnetic field along the third direction D3 increases, the magnetic resistance MR1 increases. When the magnetic field strength Has of the magnetic field along the third direction D3 is 1 or more, the magnetic resistance MR1 saturates.

As shown in FIG. 3, as the normalized detection target magnetic field Hts increases, the change in the magnetic resistance MR1 becomes gentle. For example, when the magnetic field strength Has of the magnetic field along the third direction D3 is 1.5, the magnetic resistance MR1 changes greatly according to the normalized detection target magnetic field Hts. By utilizing such characteristics, the detection target magnetic field Ht can be detected with high sensitivity by detecting the magnetic resistance.

In FIG. 4, the values of some parameters are shown in the same graph as in FIG. 3. When the detection target magnetic field Ht along the second direction D2 is zero (Hts=0.0001 in FIG. 4), the saturation value of the magnetic resistance MR1 is set to 1. When the detection target magnetic field Ht is zero, the magnetic field strength at which the magnetic resistance MR1 is 0.9 is defined as a first magnetic field value Hs1. The first magnetic field value Hs1 is of the first polarity (positive in this example). The first magnetic field value Hs1 corresponds to, for example, an approximate saturated magnetic field. In the embodiment, the absolute value of the local minimum value Hmin (see FIG. 1C) of the first magnetic field Ha is preferably larger than the absolute value of the first magnetic field value Hs1.

That is, in the embodiment, for example, it is preferable that following relation is satisfied:

Hd1−Hp/2>Hs1.

Under such a condition, the detection target magnetic field Ht can be efficiently detected with higher sensitivity.

In a state where the detection target magnetic field Ht along the second direction D2 is not applied to the first magnetic element 11, the electric resistance of the first magnetic element 11 to which a magnetic field along the crossing direction Dx (that is, the third direction D3) having the first magnetic field value Hs1 of the first polarity is applied, is 0.9 times the saturated electric resistance (saturation value of the magnetic resistance MR1). The saturated electric resistance is the saturation value of the electric resistance of the first magnetic element 11 when the magnetic field along the crossing direction Dx (that is, the third direction D3) increases.

In the embodiment, the local minimum value of the first current i1 corresponds to the difference between the DC component id1 of the first current i1 and ½ of the amplitude ip1 of the AC component ia1. This difference (the absolute value of the local minimum value of the first current i1) is preferably larger than the absolute value of the first current value of the first polarity corresponding to the first magnetic field value Hs1. For example, in a state where the detection target magnetic field Ht along the second direction D2 is not applied to the first magnetic element 11, the electric resistance of the first magnetic element 11 when a current having a first current value of the first polarity flows through the first conductive member 21 is 0.9 times the saturated electric resistance. The saturated electric resistance is a saturation value of the electric resistance of the first magnetic element 11 when a current flowing through the first conductive member 21 increases. By employing such a first current i1, the detection target magnetic field Ht can be efficiently detected with higher sensitivity.

Figure 5:
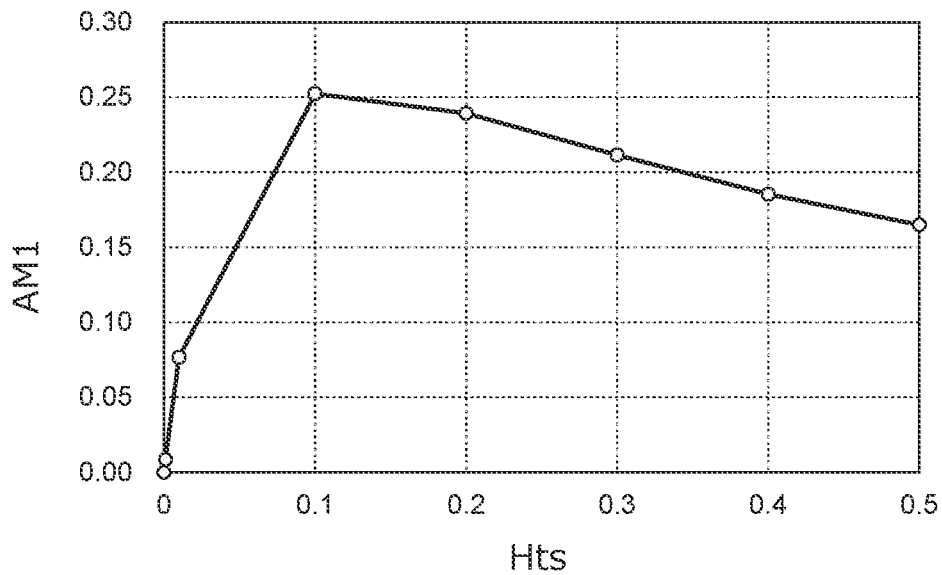
FIG. 5 is a graph illustrating the characteristics of the sensor.

FIG. 5 is a graph illustrating the characteristics of the sensor.

FIG. 5 is a graph illustrating the amplitude of the signal obtained from the first magnetic element 11. In the example of FIG. 5, in the first magnetic field Ha, a normalized value of the amplitude of the AC magnetic field component (Hp1) is 0.4. A normalized value of the DC magnetic field component Hd1 is 1.3. A normalized value of the minimum value Hmin of the first magnetic field Ha is 1.1. Under such a first magnetic field Ha, the normalized detection target magnetic field Hts is changed. The horizontal axis of FIG. 5 is the normalized detection target magnetic field Hts. The vertical axis of FIG. 5 is an amplitude AM1 of the signal obtained from the first magnetic element 11. The amplitude AM1 is a relative value when the change of the magnetic resistance MR1 from zero to the saturation value is assumed as 1.

As shown in FIG. 5, when the normalized detection target magnetic field Hts is in the range of 0 to 0.1 and the normalized detection target magnetic field Hts increases, the amplitude AM1 increases. When the normalized detection target magnetic field Hts exceeds 0.1, the amplitude AM1 gradually decreases as the normalized detection target magnetic field Hts increases.

Figure 6:
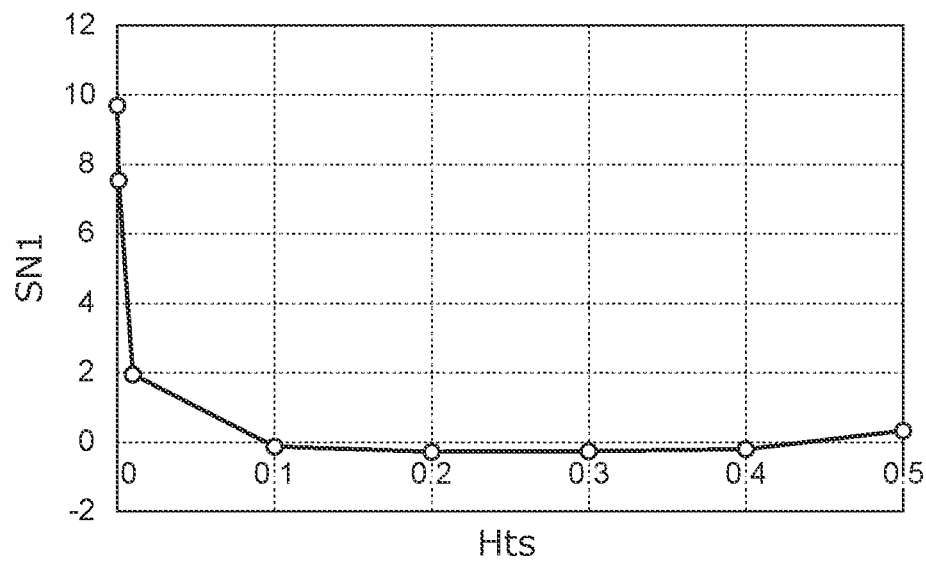
FIG. 6 is a graph illustrating the characteristics of the sensor.

FIG. 6 is a graph illustrating the characteristics of the sensor.

FIG. 6 is a graph illustrating the sensitivity of the signal obtained from the first magnetic element 11. FIG. 6 is obtained from the result shown in FIG. 5. The horizontal axis of FIG. 6 is the normalized detection target magnetic field Hts. The vertical axis of FIG. 6 is sensitivity SN1. The sensitivity SN1 is a value obtained by differentiating the amplitude AM1 with respect to the normalized detection target magnetic field Hts.

As shown in FIG. 6, when the normalized detection target magnetic field Hts is small, a high sensitivity SN1 of 2 or more can be obtained. According to the embodiment, a minute magnetic field can be detected with high sensitivity.

For example, a reference example for detecting the detection target magnetic field Ht in the hard axis direction of the magnetized free layer (in the example of FIG. 1, in the third direction D3) is considered. In this reference example, the sensitivity SN1 is 1. Therefore, in the sensor 110 according to the embodiment, the detection target magnetic field Ht in the second direction D2 can be detected with high sensitivity. According to the embodiment, it is possible to provide a sensor whose characteristics can be improved.

In the embodiment, the first magnetic field Ha with less noise can be applied to the first magnetic element 11. As a result, a low noise output can be obtained. Further, as described above, according to the embodiment, small detection target magnetic field Ht can be detected with high sensitivity.

Hereinafter, some examples of the sensor according to the embodiment will be described.

FIG. 7 is a schematic diagram illustrating the sensor according to the first embodiment.

In FIG. 7, the first magnetic element 11 is drawn shifted from the first conductive member 21 in the X-axis direction for ease of understanding. The first magnetic element 11 may overlap the first conductive member 21 in the Z-axis direction.

As shown in FIG. 7, in the sensor 111 according to the embodiment, the element portion 10U includes the first element 10A and a first resistance 31. The first resistance 31 includes a first resistance portion 31e and a first other resistance portion 31f. In this example, the first element portion 11e is electrically connected to the second circuit 72. The first other element portion 11f is electrically connected to the first resistance portion 31e. The first other resistance portion 31f is electrically connected to the second circuit 72. The third circuit 73 detects a change in the potential at the connection point between the first other element portion 11f and the first resistance portion 31e.

FIGS. 8 and 9A to 9C are schematic diagrams illustrating the sensor according to the first embodiment.

Figure 8:
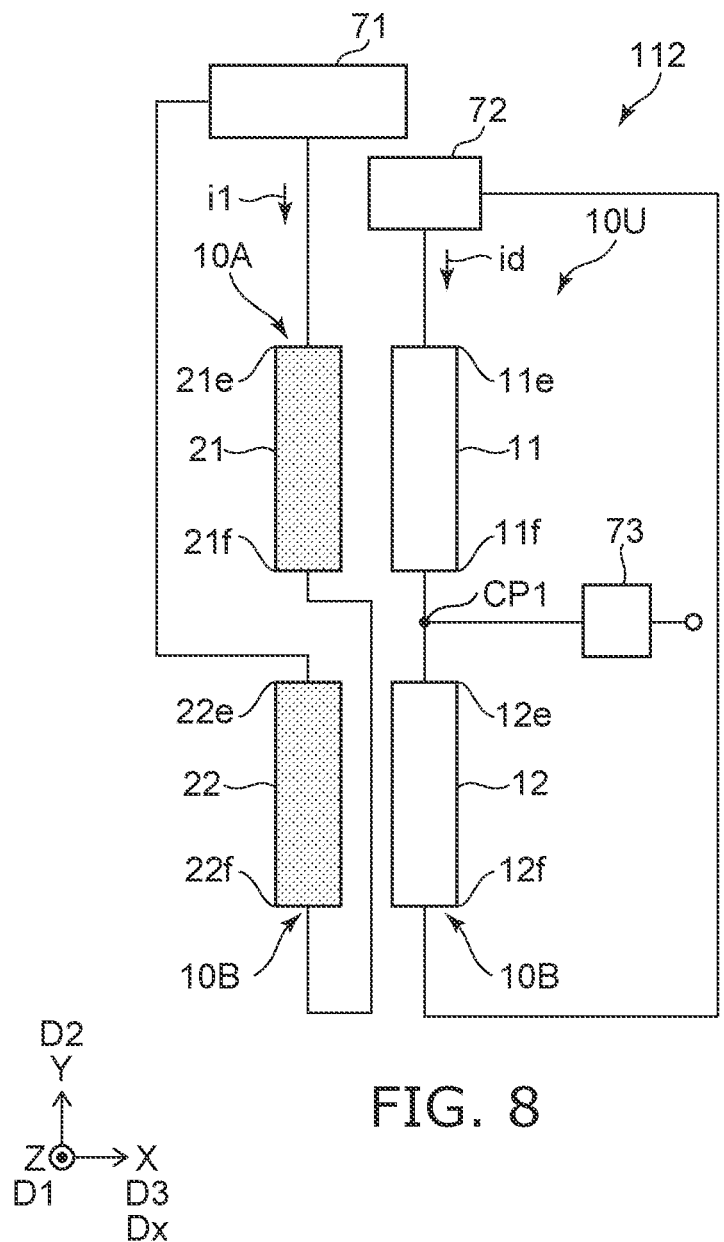
FIG. 8 is a schematic diagram illustrating the sensor according to the first embodiment.

As shown in FIG. 8, in a sensor 112 according to the embodiment, the element portion 10U further includes a second element 10B. The second element 10B includes a second magnetic element 12 and a second conductive member 22.

In FIG. 8, the first magnetic element 11 is drawn shifted from the first conductive member 21 in the X-axis direction in order to make the figure easier to see. The first magnetic element 11 may overlap the first conductive member 21 in the Z-axis direction. In FIG. 8, the second magnetic element 12 is drawn shifted from the second conductive member 22 in the X-axis direction in order to make the figure easier to see. The second magnetic element 12 may overlap the second conductive member 22 in the Z-axis direction.

As shown in FIGS. 9B and 9C, the second magnetic element 12 includes a second magnetic layer 12a and a second opposed magnetic layer 12b. In this example, the second magnetic element 12 includes a second non-magnetic layer 12n. The second non-magnetic layer 12n is provided between the second magnetic layer 12a and the second opposed magnetic layer 12b.

In the second magnetic element 12, the second magnetic layer 12a may be, for example, one of the reference layer and the magnetization free layer. The second opposed magnetic layer 12b may be, for example, the other of the reference layer and the magnetization free layer. The change in the electric resistance of the second magnetic element 12 is, for example, based on a change in an angle between the magnetization 12aM of the second magnetic layer 12a and the magnetization 12bM of the second opposed magnetic layer 12b, depending on the magnetic field applied to the second magnetic element 12.

As shown in FIG. 8, the second conductive member 22 includes a second conductive portion 22e and a second other conductive portion 22f. A direction from the second conductive portion 22e to the second other conductive portion 22f is along the second direction D2.

As shown in FIG. 8, in this example, the first conductive portion 21e is electrically connected to the first circuit 71. The first other conductive portion 21f is electrically connected to the second other conductive portion 22f. The second conductive portion 22e is electrically connected to the first circuit 71. The first circuit 71 is configured to supply the first current i1 to the first conductive member 21 and the second conductive member 22.

The first magnetic element 11 includes a first element portion 11e and a first other element portion 11f. The first element portion 11e corresponds to the first conductive portion 21e. The first other element portion 11f corresponds to the first other conductive portion 21f. An orientation from the first element portion 11e to the first other element portion 11f is a first orientation.

The second magnetic element 12 includes a second element portion 12e and a second other element portion 12f. The second element portion 12e corresponds to the second conductive portion 22e. The second other element portion 12f corresponds to the second other conductive portion 22f. A direction from the second element portion 12e to the second other element portion 12f is a second orientation.

The detection current id supplied from the second circuit 72 flows through the first magnetic element 11 in the first orientation and flows through the second magnetic element 12 in the second orientation. When the first current i1 supplied from the first circuit 71 flows through the first conductive member 21 in the first orientation, the first current i1 flows through the second conductive member 22 in the opposite direction in the second orientation.

Figure 10:
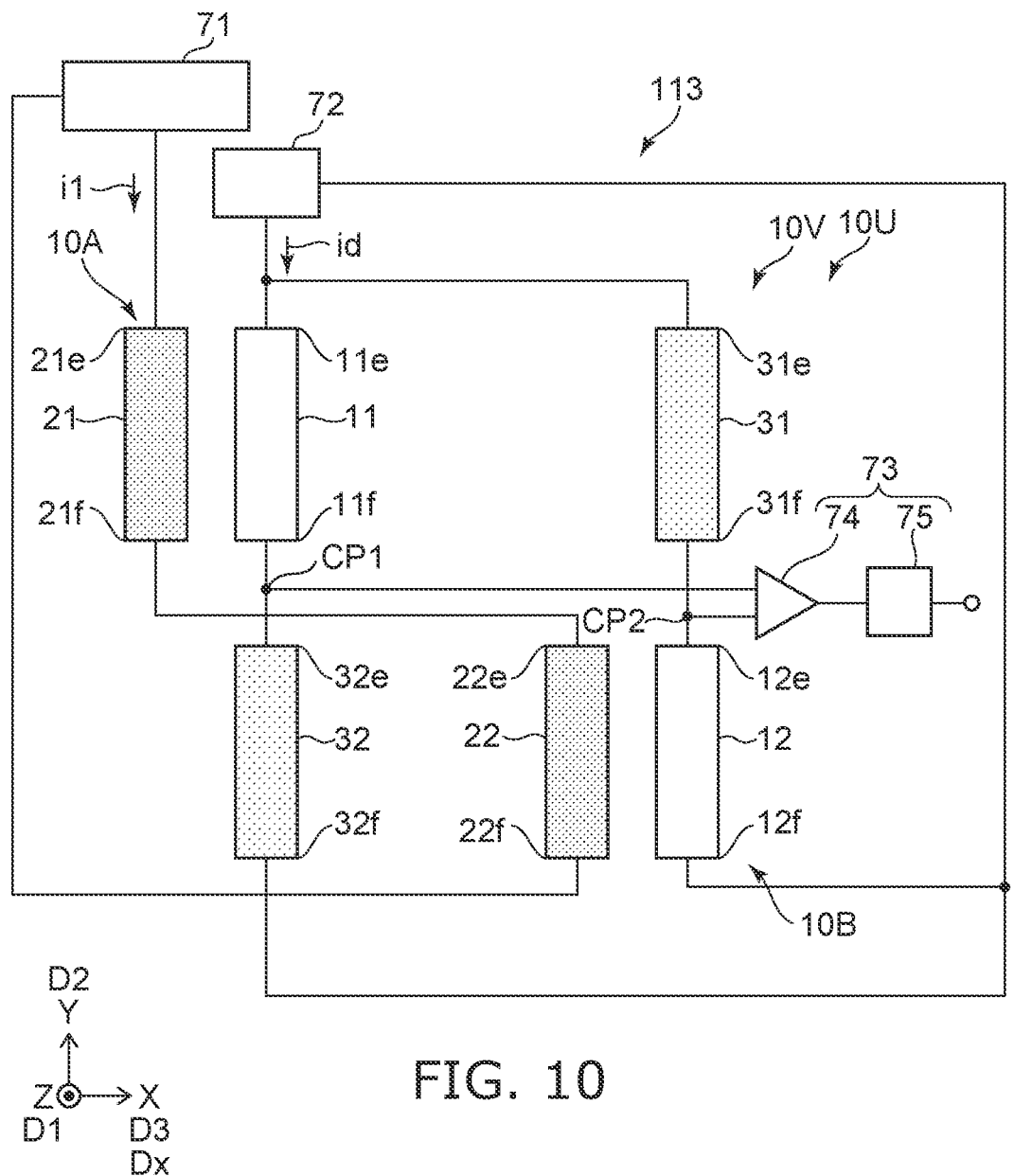
FIG. 10 is a schematic diagram illustrating the sensor according to the first embodiment.

FIG. 10 is a schematic diagram illustrating the sensor according to the first embodiment.

As shown in FIG. 10, in a sensor 113 according to the embodiment, the element portion 10U includes a first element 10A, a second element 10B, a first resistance 31 and a second resistance 32. The first element 10A includes the first magnetic element 11 and the first conductive member 21. The second element 10B includes the second magnetic element 12 and the second conductive member 22. In FIG. 10, in order to make the figure easier to see, the first magnetic element 11 is drawn shifted from the first conductive member 21 in the X-axis direction. In FIG. 10, the second magnetic element 12 is drawn shifted from the second conductive member 22 in the X-axis direction in order to make the figure easier to see.

The first magnetic element 11 includes the first element portion 11e and the first other element portion 11f. The first element portion 11e corresponds to the first conductive portion 21e. The first other element portion 11f corresponds to the first other conductive portion 21f. The orientation from the first element portion 11e to the first other element portion 11f is the first orientation.

The second element 10B includes the second magnetic element 12 and the second conductive member 22. The second conductive member 22 includes the second conductive portion 22e and the second other conductive portion 22f. A direction from the second conductive portion 22e to the second other conductive portion 22f is along the second direction D2.

The first resistance 31 includes the first resistance portion 31e and the first other resistance portion 31f. A direction from the first resistance portion 31e to the first other resistance portion 31f is along the second direction D2. The second resistance 32 includes a second resistance portion 32e and a second other resistance portion 32f. A direction from the second resistance portion 32e to the second other resistance portion 32f is along the second direction D2.

The second magnetic element 12 includes the second element portion 12e and the second other element portion 12f. The second element portion 12e corresponds to the second conductive portion 22e. The second other element portion 12f corresponds to the second other conductive portion 22f. An orientation from the second element portion 12e to the second other element portion 12f is the second orientation.

The first element portion 11e is electrically connected to the second circuit 72. The first other element portion 11f is electrically connected to the second resistance portion 32e. The second other resistance portion 32f is electrically connected to the second circuit 72.

The first resistance portion 31e is electrically connected to the second circuit 72. The first other resistance portion 31f is electrically connected to the second element portion 12e. The second other element portion 12f is electrically connected to the second circuit 72.

The detection current id flows through the first magnetic element 11 in the first orientation and flows through the second magnetic element 12 in the second orientation.

As shown in FIG. 10, in this example, the first conductive portion 21e is electrically connected to the first circuit 71. The first other conductive portion 21f is electrically connected to the second conductive portion 22e. The second other conductive portion 22f is electrically connected to the first circuit 71. The first circuit 71 can supply the first current i1 to the first conductive member 21 and the second conductive member 22.

When the first current i1 flows through the first conductive member 21 in the first orientation, the first current i1 flows through the second conductive member 22 in the second orientation.

The third circuit 73 is configured to detect a potential difference between a first connection point CP1 and a second connection point CP2. The first connection point CP1 is a connection point between the first other element portion 11f and the second resistance portion 32e. The second connection point CP2 is a connection point between the first other resistance portion 31f and the second element portion 12e.

The third circuit 73 may include a differential amplifier 74 and a processing circuit 75. The differential amplifier 74 detects the potential difference between the first connection point CP1 and the second connection point CP2. The processing circuit 75 processes the output signal from the differential amplifier 74. The processing circuit 75 may include, for example, at least one of a lock-in amplifier, a bandpass filter circuit, or an FFT (Fast Fourier Transform) circuit. The processing circuit 75 extracts, for example, the first frequency component of the differential amplifier 74. The first frequency is, for example, the frequency of the AC component ia1 of the first current i1. The first frequency is, for example, the frequency of the AC magnetic field component Ha1 of the first magnetic field Ha. The first frequency may include, for example, a harmonic component of the AC component ia1 of the first current i1. The first frequency may include, for example, a harmonic component of the AC magnetic field component Ha1 of the first magnetic field Ha.

As described above, the element portion 10U may include a bridge circuit 10V (see FIG. 10) including the first element 10A. The second circuit 72 can supply the detection current id to the bridge circuit 10V. The third circuit 73 is configured to detect a value corresponds to a difference between the potential of the first midpoint (for example, the first connection point CP1) of the bridge circuit 10V and the potential of the second midpoint (for example, the second connection point CP2) of the bridge circuit 10V.

Figure 11:
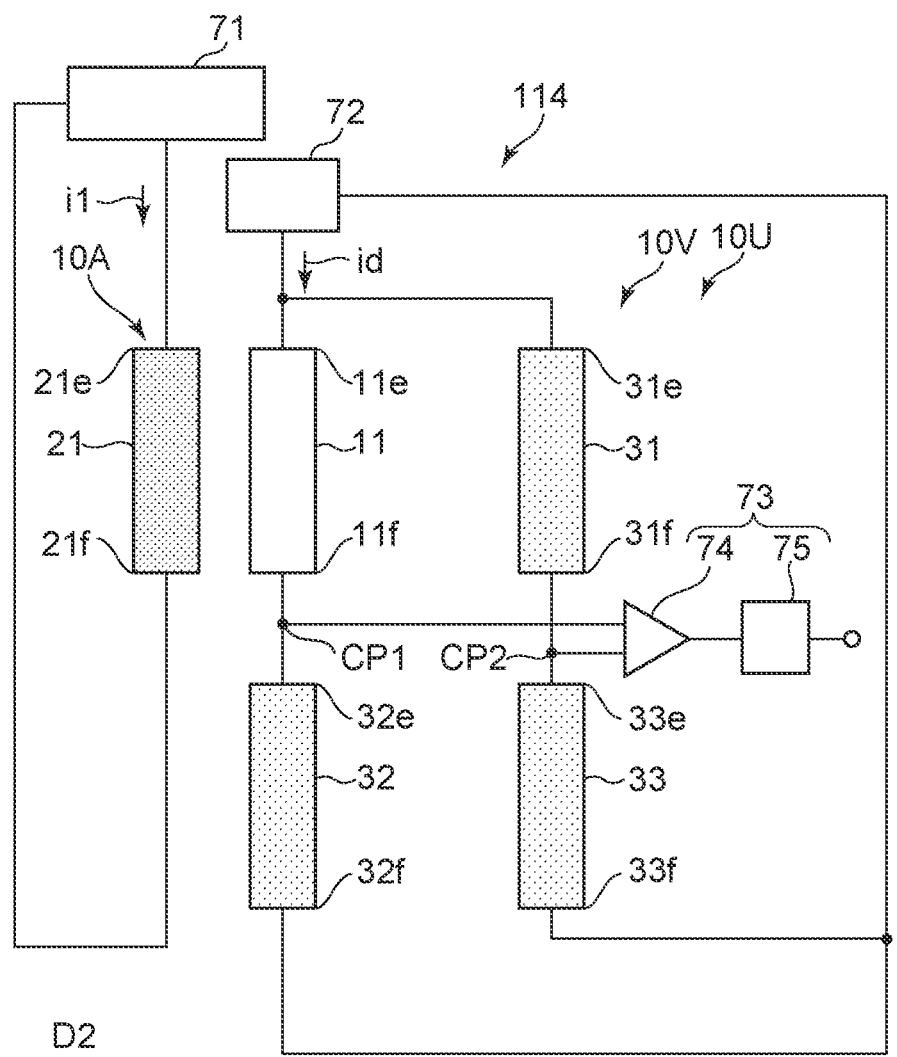
FIG. 11 is a schematic diagram illustrating the sensor according to the first embodiment.

FIG. 11 is a schematic diagram illustrating the sensor according to the first embodiment.

As shown in FIG. 11, in a sensor 114 according to the embodiment, the element portion 10U includes the first element 10A, the first resistance 31, the second resistance 32, and a third resistance 33. The third resistance 33 includes a third resistance portion 33e and a third other resistance portion 33f. The direction from the third resistance portion 33e to the third other resistance portion 33f is along the second direction D2.

In this example, the first element portion 11e is electrically connected to the second circuit 72. The first other element portion 11f is electrically connected to the second resistance portion 32e. The second other resistance portion 32f is electrically connected to the second circuit 72. The first resistance portion 31e is electrically connected to the second circuit 72. The first other resistance portion 31f is electrically connected to the third resistance portion 33e. The third other resistance portion 33f is electrically connected to the second circuit 72. The first connection point CP1 is a connection point between the first other element portion 11f and the second resistance portion 32e. The second connection point CP2 is a connection point between the first other resistance portion 31f and the third resistance portion 33e.

FIGS. 12, 13A to 13C, and 14A to 14C are schematic views illustrating the sensor according to the first embodiment.

Figure 12:
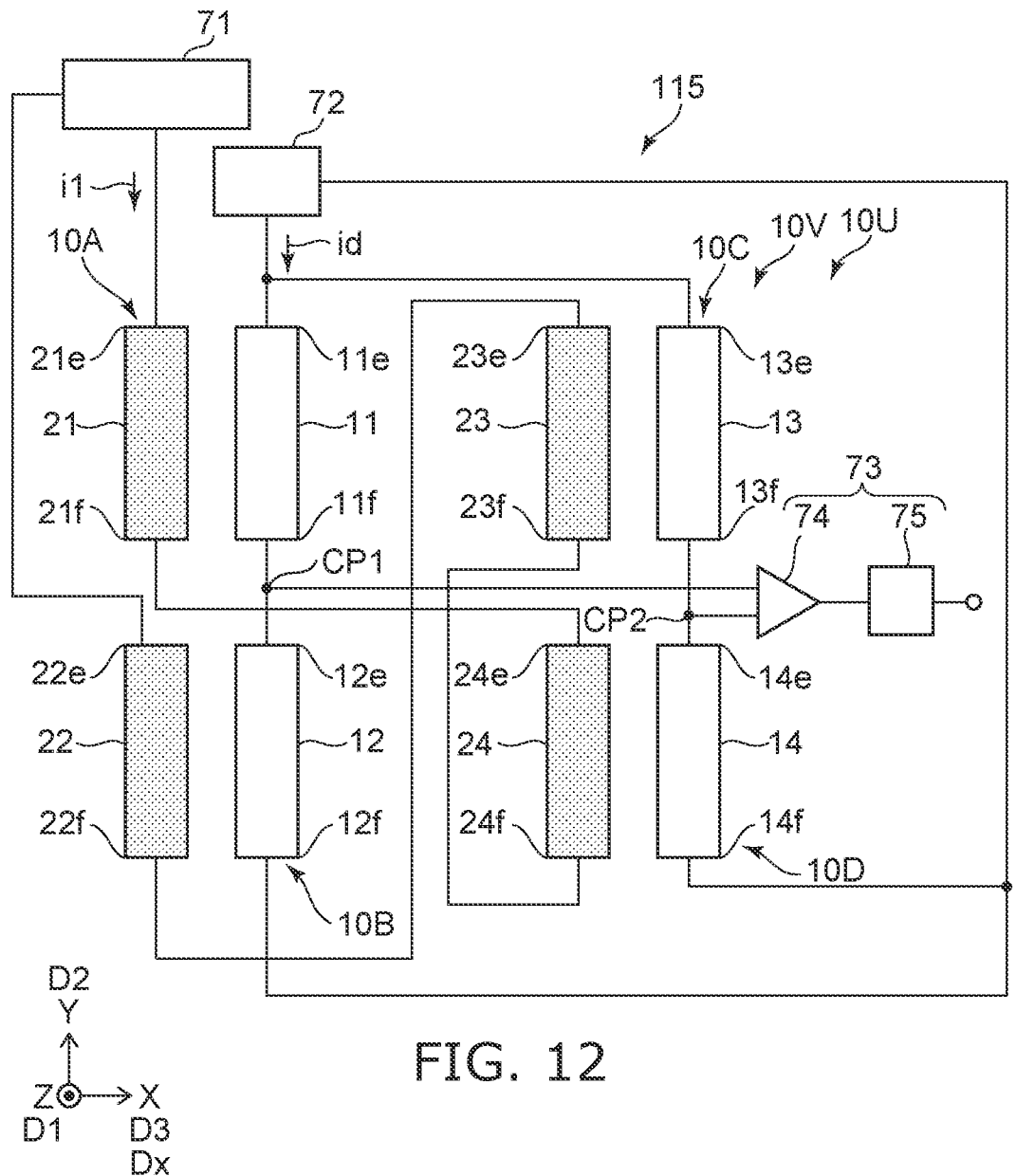
FIG. 12 is a schematic diagram illustrating the sensor according to the first embodiment.

As shown in FIG. 12, in a sensor 115 according to the embodiment, the element portion 10U includes the first element 10A, the second element 10B, the third element 10C, and a fourth element 10D. The first element 10A includes the first magnetic element 11 and the first conductive member 21. The second element 10B includes the second magnetic element 12 and the second conductive member 22. The third element 10C includes the third magnetic element 13 and the third conductive member 23. The fourth element 10D includes a fourth magnetic element 14 and a fourth conductive member 24.

As shown in FIGS. 13B and 13C, the third magnetic element 13 includes a third magnetic layer 13a and a third opposed magnetic layer 13b. In this example, the third magnetic element 13 includes a third non-magnetic layer 13n. The third non-magnetic layer 13n is provided between the third magnetic layer 13a and the third opposed magnetic layer 13b.

In the third magnetic element 13, the third magnetic layer 13a may be, for example, one of the reference layer and the magnetization free layer. The third opposed magnetic layer 13b may be, for example, the other of the reference layer and the magnetization free layer. The change in the electric resistance of the third magnetic element 13 is, for example, based on a change in an angle between the magnetization 13aM of the third magnetic layer 13a and the magnetization 13bM of the third opposed magnetic layer 13b, depending on the magnetic field applied to the third magnetic element 13.

Figure 14A:
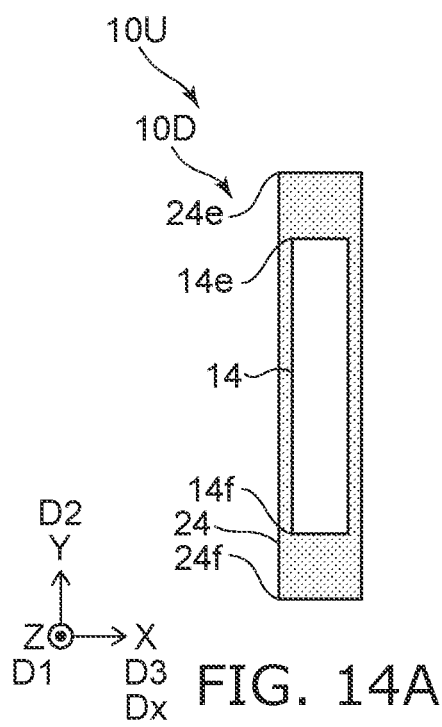
FIGS. 14A to 14C are schematic views illustrating the sensor according to the first embodiment.
Figure 14B:
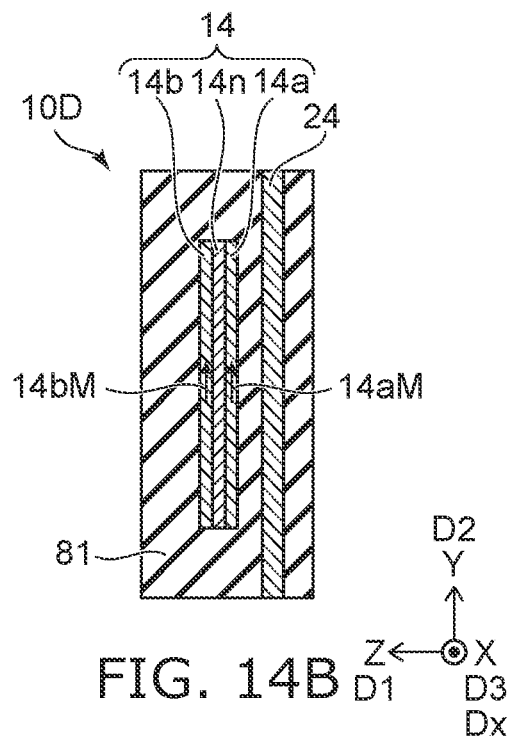
Figure 14C:
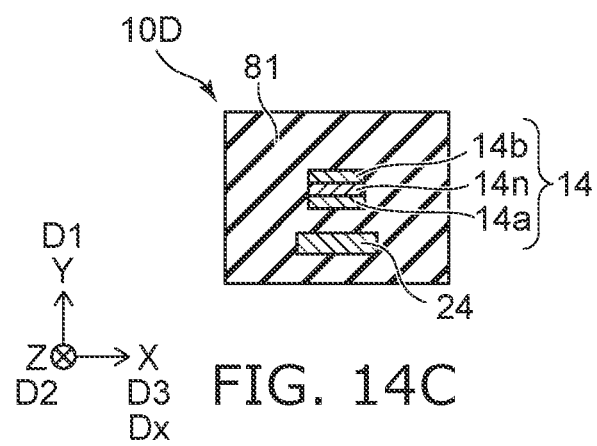

As shown in FIGS. 14B and 14C, the fourth magnetic element 14 includes a fourth magnetic layer 14a and a fourth opposed magnetic layer 14b. In this example, the fourth magnetic element 14 includes a fourth non-magnetic layer 14n. The fourth non-magnetic layer 14n is provided between the fourth magnetic layer 14a and the fourth opposed magnetic layer 14b.

In the fourth magnetic element 14, the fourth magnetic layer 14a may be, for example, one of the reference layer and the magnetization free layer. The fourth opposed magnetic layer 14b may be, for example, the other of the reference layer and the magnetization free layer. The change in the electric resistance of the fourth magnetic element 14 is, for example, based on change in angle between the magnetization 14aM of the fourth magnetic layer 14a and the magnetization 14bM of the fourth opposed magnetic layer 14b, depending on the magnetic field applied to the fourth magnetic element 14.

As shown in FIG. 13A, the third conductive member 23 includes a third conductive portion 23e and a third other conductive portion 23f. The direction from the third conductive portion 23e to the third other conductive portion 23f is along the second direction D2.

As shown in FIG. 14A, the fourth conductive member 24 includes a fourth conductive portion 24e and a fourth other conductive portion 24f. The direction from the fourth conductive portion 24e to the fourth other conductive portion 24f is along the second direction D2.

As shown in FIG. 12, the first magnetic element 11 includes a first element portion 11e and a first other element portion 11f. The first element portion 11e corresponds to the first conductive portion 21e. The first other element portion 11f corresponds to the first other conductive portion 21f. An orientation from the first element portion 11e to the first other element portion 11f is the first orientation.

As shown in FIG. 12, the second magnetic element 12 includes a second element portion 12e and a second other element portion 12f. The second element portion 12e corresponds to the second conductive portion 22e. The second other element portion 12f corresponds to the second other conductive portion 22f. An orientation from the second element portion 12e to the second other element portion 12f is a second orientation.

As shown in FIG. 12, the third magnetic element 13 includes a third element portion 13e and a third other element portion 13f. The third element portion 13e corresponds to the third conductive portion 23e. The third other element portion 13f corresponds to the third other conductive portion 23f. An orientation from the third element portion 13e to the third other element portion 13f is a third orientation.

As shown in FIG. 12, the fourth magnetic element 14 includes a fourth element portion 14e and a fourth other element portion 14f. The fourth element portion 14e corresponds to the fourth conductive portion 24e. The fourth other element portion 14f corresponds to the fourth other conductive portion 24f. An orientation from the fourth element portion 14e to the fourth other element portion 14f is a fourth orientation.

The first element portion 11e is electrically connected to the second circuit 72. The first other element portion 11f is electrically connected to the second element portion 12e. The second other element portion 12f is electrically connected to the second circuit 72.

The third element portion 13e is electrically connected to the second circuit 72. The third other element portion 13f is electrically connected to the fourth element portion 14e. The fourth other element portion 14f is electrically connected to the second circuit 72.

The detection current id flows through the first magnetic element 11 in the first orientation, flows through the second magnetic element 12 in the second orientation, flows through the third magnetic element 13 in the third orientation, and flows through the fourth magnetic element 14 in the fourth orientation.

In this example, the first conductive portion 21e is electrically connected to the first circuit 71. The first other conductive portion 21f is electrically connected to the fourth conductive portion 24e. The fourth other conductive portion 24f is electrically connected to the third other conductive portion 23f. The third conductive portion 23e is electrically connected to the second other conductive portion 22f. The second conductive portion 22e is electrically connected to the first circuit 71.

When the first current i1 supplied from the first circuit 71 flows through the first conductive member 21 in the first orientation, the first current i1 flows through the second conductive member 22 in the opposite orientation to the second orientation, the first current i1 flows through the third conductive member 23 in the opposite orientation to the third orientation, and the first current i1 flows through the fourth conductive member 24 in the fourth orientation.

The first connection point CP1 is a connection point between the first other element portion 11f and the second element portion 12e. The second connection point CP2 is a connection point between the third other element portion 13f and the fourth element portion 14e.

Figure 15:
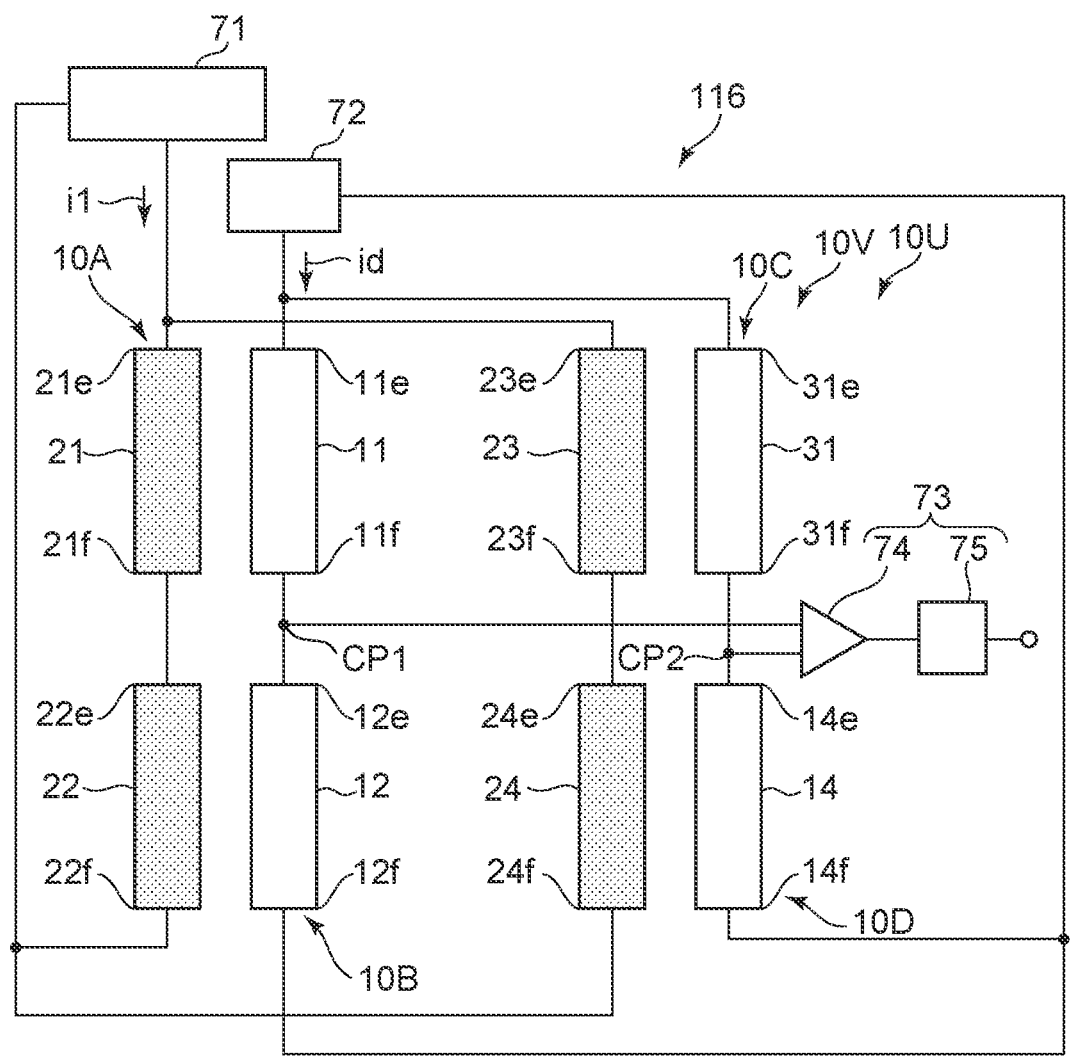
FIG. 15 is a schematic diagram illustrating the sensor according to the first embodiment.

FIG. 15 is a schematic diagram illustrating the sensor according to the first embodiment.

As shown in FIG. 15, in a sensor 116 according to the embodiment, the element portion 10U includes the first element 10A, the second element 10B, the third element 10C, and the fourth element 10D. In the sensor 116, the connection relationship of the plurality of conductive members is different from the connection relationship of the plurality of conductive members in the sensor 115. In the sensor 116, the connection relationship of the plurality of magnetic elements may be the same as the connection relationship of the plurality of magnetic elements in the sensor 115.

In the sensor 116, the first conductive portion 21e and the third conductive portion 23e are electrically connected to the first circuit 71. The first other conductive portion 21f is electrically connected to the second conductive portion 22e. The third other conductive portion 23f is electrically connected to the fourth conductive portion 24e. The second other conductive portion 22f and the fourth other conductive portion 24f are electrically connected to the first circuit 71.

In the sensor 116, the orientation of magnetization in the reference layer of the first magnetic element 11 is the same as the orientation of magnetization in the reference layer of the fourth magnetic element 14. The orientation of magnetization in the reference layer of the second magnetic element 12 is the same as the orientation of magnetization in the reference layer of the third magnetic element 13. The orientation of magnetization in the reference layer of the first magnetic element 11 and the orientation of magnetization in the reference layer of the fourth magnetic element 14 are opposite to the orientation of magnetization in the reference layer of the second magnetic element 12 and orientation of magnetization in the reference layer of the third magnetic element 13. Also in the configuration of the sensor 116, it is possible to provide a sensor capable of suppressing the influence of noise and improving the characteristics.

Second Embodiment

The second embodiment relates to an inspection device. As will be described later, the inspection device may include a diagnostic device.

Figure 16:
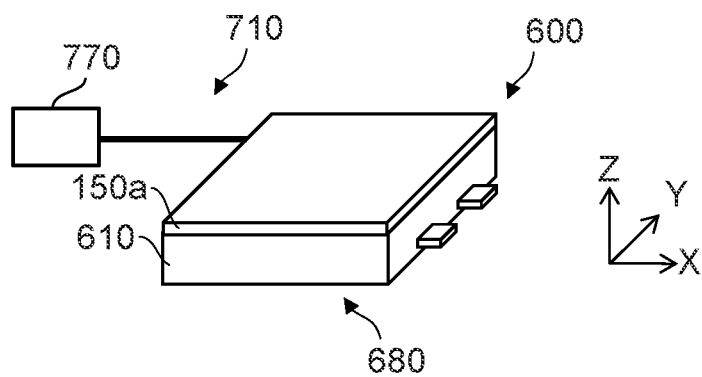
FIG. 16 is a schematic perspective view showing an inspection device according to a second embodiment.

FIG. 16 is a schematic perspective view illustrating an inspection device according to a second embodiment.

As shown in FIG. 16, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 17:
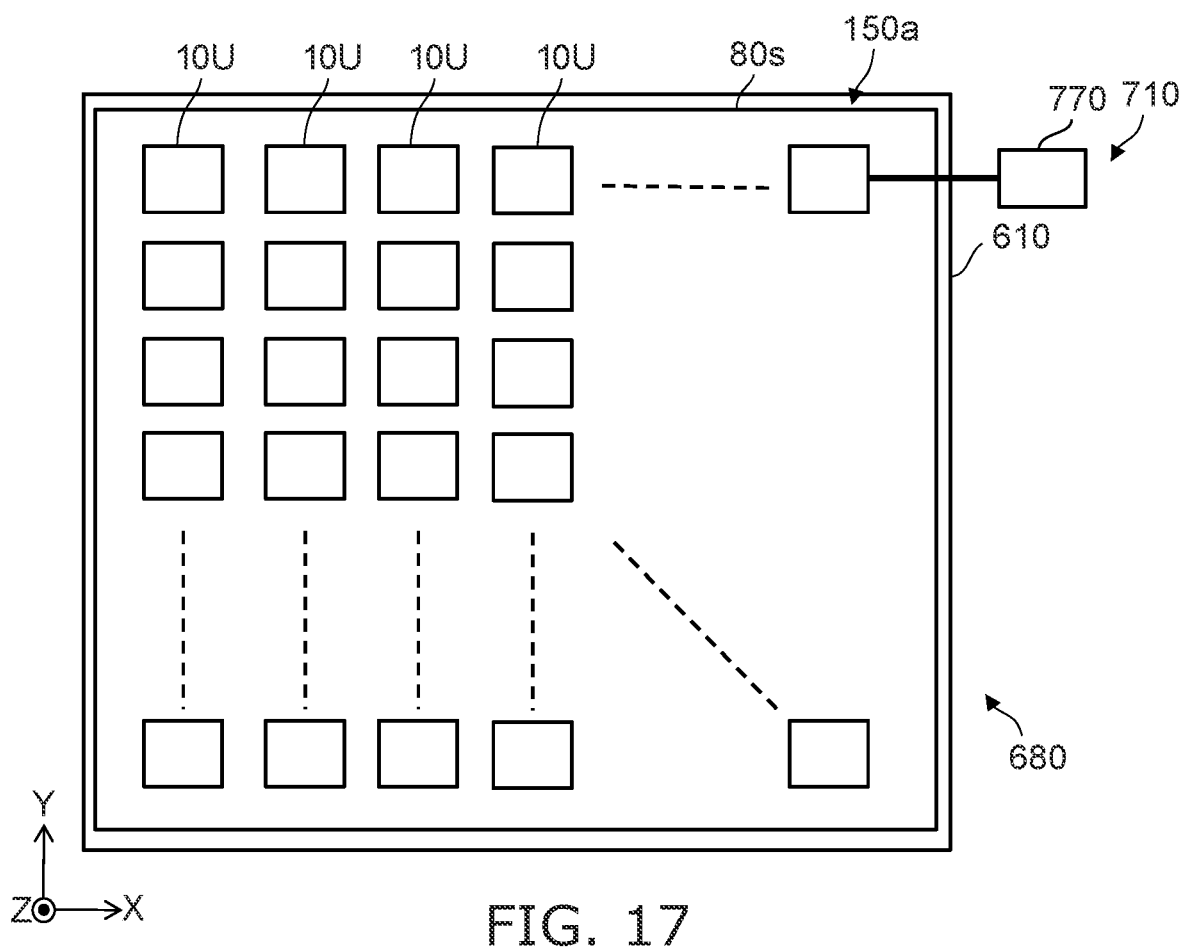
FIG. 17 is a schematic plan view showing the inspection device according to the second embodiment.

FIG. 17 is a schematic plan view illustrating the inspection device according to the second embodiment.

As shown in FIG. 17, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

FIG. 18 is a schematic view illustrating the sensor and the inspection device according to the embodiment.

As shown in FIG. 18, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 18, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 18, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 18, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 19:
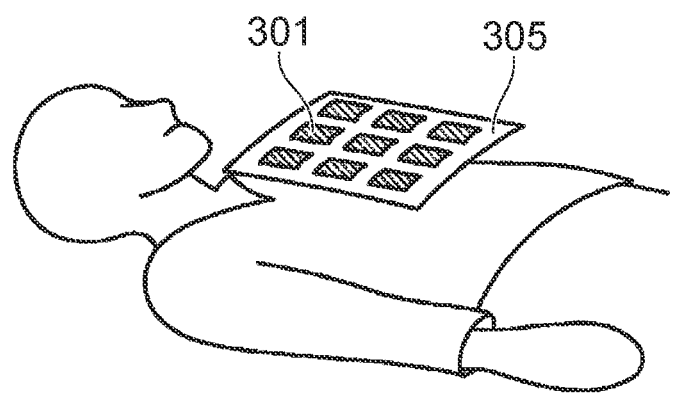
FIG. 19 is a schematic diagram showing an inspection device according to an embodiment.

FIG. 19 is a schematic view illustrating the inspection device according to the embodiment.

FIG. 19 is an example of a magnetocardiograph. In the example shown in FIG. 19, the sensor part 301 is provided on a flat plate-shaped hard base body 305.

In the example shown in FIG. 19, the input/output of the signal obtained from the sensor part 301 is the same as the input/output described with respect to FIG. 18. In the example shown in FIG. 19, the processing of the signal obtained from the sensor part 301 is the same as the processing described with respect to FIG. 18.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

(Configuration 1)

A sensor, comprising:
an element portion including a first element, the first element including a first magnetic element and a first conductive member,
the first magnetic element including a first magnetic layer and a first opposed magnetic layer,
the first conductive member including a first conductive portion and a first other conductive portion, a second direction from the first conductive portion to the first other conductive portion crossing a first direction from the first magnetic layer to the first opposed magnetic layer; and
a controller including a first circuit, the first circuit being connected to the first conductive portion and the first other conductive portion, the first circuit being configured to supply a first current to the first conductive member, the first current including an alternating current component, a local minimum value of the first current being of a first polarity, and a local maximum value of the first current being of the first polarity.

(Configuration 2)

The sensor according to Configuration 1, wherein a first electric resistance of the first magnetic element changes according to a change of the first current.

(Configuration 3)

The sensor according to Configuration 2, wherein
a rate of change of the first electric resistance with respect to a change of a second direction magnetic field is higher than a rate of change of the first electric resistance with respect to a change of a third direction magnetic field,
the second direction magnetic field includes a component of the second direction,
the third direction magnetic field includes a component of a third direction, and
the third direction crosses a plane including the first direction and the second direction.

(Configuration 4)

The sensor according to Configuration 1 or 2, wherein a length of the first magnetic element in the second direction is longer than a length of the first magnetic element in the third direction crossing the plane including the first direction and the second direction.

(Configuration 5)

The sensor according to any one of Configurations 1-4, wherein when the first current is not flowing, a magnetization of the first magnetic layer is along the second direction, and a magnetization of the first opposed magnetic layer is along the second direction.

(Configuration 6)

The sensor according to Configuration 2 or 3, wherein
the controller includes a second circuit, and
the second circuit is configured to supply a detection current to the first magnetic element.

(Configuration 7)

The sensor according to Configuration 6, wherein
the controller includes a third circuit, and
the third circuit is configured to detect a value corresponding to a change in the first electric resistance.

(Configuration 8)

The sensor according to Configuration 7, wherein
the element portion includes a bridge circuit including the first element,
the second circuit is configured to supply a detection current to the bridge circuit, and
the third circuit is configured to detect a value corresponding to a difference between a potential of a first midpoint of the bridge circuit and a potential of a second midpoint of the bridge circuit.

(Configuration 9)

The sensor according to Configuration 7, wherein
the element portion further includes a second element;
the second element includes a second magnetic element and a second conductive member,
the second magnetic element includes a second magnetic layer and a second opposed magnetic layer,
the second conductive member includes a second conductive portion and a second other conductive portion, a direction from the second conductive portion to the second other conductive portion is along the second direction,
the first conductive portion is electrically connected to the first circuit,
the first other conductive portion is electrically connected to the second other conductive portion,
the second conductive portion is electrically connected to the first circuit,
the first circuit is configured to supply the first current to the second conductive member,
the first magnetic element includes a first element portion and a first other element portion, the first element portion corresponds to the first conductive portion, the first other element portion corresponds to the first other conductive portion, an orientation from the first element portion to the first other element portion is a first orientation,
the second magnetic element includes a second element portion and a second other element portion, the second element portion corresponds to the second conductive portion, the second other element portion corresponds to the second other conductive portion, an orientation from the second element portion to the second other element portion is a second orientation,
the detection current flows through the first magnetic element in the first orientation and flows through the second magnetic element in the second orientation, and
when the first current flows through the first conductive member in the first orientation, the first current flows through the second conductive member in an opposite orientation to the second orientation.

(Configuration 10)

The sensor according to Configuration 7, wherein
the element portion further includes
a second element,
a first resistance, and
a second resistance,
the first magnetic element includes a first element portion and a first other element portion, the first element portion corresponds to the first conductive portion, the first other element portion corresponds to the first other conductive portion, an orientation from the first element portion to the first other element portion is a first orientation,
the second element includes a second magnetic element and a second conductive member,
the second magnetic element includes a second magnetic layer and a second opposed magnetic layer,
the second conductive member includes a second conductive portion and a second other conductive portion, a direction from the second conductive portion to the second other conductive portion is along the second direction,
the first resistance includes a first resistance portion and a first other resistance portion, a direction from the first resistance portion to the first other resistance portion is along the second direction,
the second resistance includes a second resistance portion and a second other resistance portion, a direction from the second resistance portion to the second other resistance portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the first element portion is electrically connected to the second circuit,
the first other element portion is electrically connected to the second resistance portion, the second other resistance portion is electrically connected to the second circuit, the first resistance portion is electrically connected to the second circuit, the first other resistance portion is electrically connected to the second element portion, the second other element portion is electrically connected to the second circuit, the detection current flows through the first magnetic element in the first orientation, and flows through the second magnetic element in the second orientation, and when the first current flows through the first conductive member in the first orientation, the first current flows through the second conductive member in the second orientation.

(Configuration 11)

The sensor according to Configuration 7, wherein
the element portion further includes
a second element,
a third element, and
a fourth element, the first magnetic element includes a first element portion and a first other element portion, the first element portion corresponds to the first conductive portion, the first other element portion corresponds to the first other conductive portion, an orientation from the first element portion to the first other element portion is a first orientation, the second element includes a second magnetic element and a second conductive member, the second magnetic element includes a second magnetic layer and a second opposed magnetic layer, the second conductive member includes a second conductive portion and a second other conductive portion, the direction from the second conductive portion to the second other conductive portion is along the second direction, the second magnetic element includes a second element portion and a second other element portion, the second element portion corresponds to the second conductive portion, the second other element portion corresponds to the second other conductive portion, an orientation from the second element portion to the second other element portion is a second orientation, the third element includes a third magnetic element and a third conductive member, the third magnetic element includes a third magnetic layer and a third opposed magnetic layer, the third conductive member includes a third conductive portion and a third other conductive portion, a direction from the third conductive portion to the third other conductive portion is along the second direction, the third magnetic element includes a third element portion and a third other element portion, the third element portion corresponds to the third conductive portion, the third other element portion corresponds to the third other conductive portion, an orientation from the third element portion to the third other element portion is a third orientation, the fourth element includes a fourth magnetic element and a fourth conductive member, the fourth magnetic element includes a fourth magnetic layer and a fourth opposed magnetic layer, the fourth conductive member includes a fourth conductive portion and a fourth other conductive portion, a direction from the fourth conductive portion to the fourth other conductive portion is along the second direction, the fourth magnetic element includes a fourth element portion and a fourth other element portion, the fourth element portion corresponds to the fourth conductive portion, the fourth other element portion corresponds to the fourth other conductive portion, an orientation from the fourth element portion to the fourth other element portion is a fourth orientation, the first element portion is electrically connected to the second circuit, the first other element portion is electrically connected to the second element portion, the second other element portion is electrically connected to the second circuit, the third element portion is electrically connected to the second circuit, the third other element portion is electrically connected to the fourth element portion, the fourth other element portion is electrically connected to the second circuit, the detection current flows through the first magnetic element in the first orientation, flows through the second magnetic element in the second orientation, flows through the third magnetic element in the third orientation, and flows through the fourth magnetic element in the fourth orientation, when the first current flows through the first conductive member in the first orientation, the first current flows through the second conductive member in an opposite orientation to the second orientation, the first current flows through the third conductive member in an opposite orientation to the third orientation, and the first current flows through the fourth conductive member in the fourth orientation.

(Configuration 12)

The sensor according to any one of Configurations 1-11, wherein an absolute value of the local minimum value of the first current is larger than an absolute value of the first current value of the first polarity, in a state where a detection target magnetic field along the second direction is not applied to the first magnetic element, an electric resistance of the first magnetic element when a current having the first current value flows through the first conductive member is 0.9 times a saturated electric resistance, and the saturated electric resistance is a saturation value of the electric resistance of the first magnetic element when a current flowing through the first conductive member increases.

(Configuration 13)

A sensor comprising:

an element portion including a first element, the first element including a first magnetic element, the first magnetic element including a first magnetic layer and a first opposed magnetic layer; and a controller including a magnetic field generating portion, the magnetic field generating portion being configured to generate a first magnetic field along a crossing direction crossing a first direction from the first magnetic layer to the first opposed magnetic layer, the first magnetic field including an AC magnetic field component, a local minimum value of the first magnetic field being of a first polarity, a local maximum value of the first magnetic field being of the first polarity.

(Configuration 14)

The sensor according to Configuration 13, wherein
an absolute value of the local minimum value of the first magnetic field is larger than an absolute value of a first magnetic field value of the first polarity,
in a state where a detection target magnetic field along the second direction is not applied to the first magnetic element, an electric resistance of the first magnetic element when a magnetic field along the crossing direction having the first magnetic field value is applied to the first magnetic element is 0.9 times a saturated electric resistance, and
the saturated electric resistance is a saturation value of an electric resistance of the first magnetic element when a magnetic field along the crossing direction increases.

(Configuration 15)

The sensor according to Configuration 13 or 14, wherein a first electric resistance of the first magnetic element changes according to a change of the first magnetic field.

(Configuration 16)

The sensor according to any one of Configurations 1-15, wherein the first magnetic element includes a first nonmagnetic layer provided between the first magnetic layer and the first opposed magnetic layer.

(Configuration 17)

The sensor according to any one of Configurations 1-16, wherein
the first element includes a first insulating member, and
at least a part of the first insulating member is provided between the first magnetic element and the first conductive member.

(Configuration 18)

The sensor according to any one of Configurations 1-17, wherein a direction from the first conductive member to the first magnetic element is along the first direction.

(Configuration 19)

An inspection device, comprising
the sensor according to any one of Configurations 1-18; and
a processer configured to processes an output signal obtained from the sensor.

According to the embodiment, it is possible to provide a sensor and an inspection device capable of improving the characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors and inspection devices such as magnetic layers, magnetic elements, conductive members, controllers, processers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensos and all inspection devices practicable by an appropriate design modification by one skilled in the art based on the sensos and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
an element portion including a first element, the first element including a first magnetic element and a first conductive member,
the first magnetic element including a first magnetic layer and a first opposed magnetic layer,
the first conductive member including a first conductive portion and a first other conductive portion, a second direction from the first conductive portion to the first other conductive portion crossing a first direction from the first magnetic layer to the first opposed magnetic layer; and
a controller including a first circuit, the first circuit being connected to the first conductive portion and the first other conductive portion, the first circuit being configured to supply a first current to the first conductive member, the first current including an alternating current component, a local minimum value of the first current being of a first polarity, and a local maximum value of the first current being of the first polarity.

2. The sensor according to claim 1, wherein a first electric resistance of the first magnetic element changes according to a change of the first current.

3. The sensor according to claim 2, wherein
a rate of change of the first electric resistance with respect to a change of a second direction magnetic field is higher than a rate of change of the first electric resistance with respect to a change of a third direction magnetic field,
the second direction magnetic field includes a component of the second direction,
the third direction magnetic field includes a component of a third direction, and
the third direction crosses a plane including the first direction and the second direction.

4. The sensor according to claim 2, wherein
the controller includes a second circuit, and
the second circuit is configured to supply a detection current to the first magnetic element.

5. The sensor according to claim 4, wherein
the controller includes a third circuit, and
the third circuit is configured to detect a value corresponding to a change in the first electric resistance.

6. The sensor according to claim 5, wherein
the element portion includes a bridge circuit including the first element,
the second circuit is configured to supply a detection current to the bridge circuit, and
the third circuit is configured to detect a value corresponding to a difference between a potential of a first midpoint of the bridge circuit and a potential of a second midpoint of the bridge circuit.

7. The sensor according to claim 5, wherein
the element portion further includes a second element;
the second element includes a second magnetic element and a second conductive member,
the second magnetic element includes a second magnetic layer and a second opposed magnetic layer,
the second conductive member includes a second conductive portion and a second other conductive portion, a direction from the second conductive portion to the second other conductive portion is along the second direction,
the first conductive portion is electrically connected to the first circuit,
the first other conductive portion is electrically connected to the second other conductive portion,
the second conductive portion is electrically connected to the first circuit,
the first circuit is configured to supply the first current to the second conductive member,
the first magnetic element includes a first element portion and a first other element portion, the first element portion corresponds to the first conductive portion, the first other element portion corresponds to the first other conductive portion, an orientation from the first element portion to the first other element portion is a first orientation,
the second magnetic element includes a second element portion and a second other element portion, the second element portion corresponds to the second conductive portion, the second other element portion corresponds to the second other conductive portion, an orientation from the second element portion to the second other element portion is a second orientation,
the detection current flows through the first magnetic element in the first orientation and flows through the second magnetic element in the second orientation, and
when the first current flows through the first conductive member in the first orientation, the first current flows through the second conductive member in an opposite orientation to the second orientation.

8. The sensor according to claim 5, wherein
the element portion further includes
a second element,
a first resistance, and
a second resistance,
the first magnetic element includes a first element portion and a first other element portion, the first element portion corresponds to the first conductive portion, the first other element portion corresponds to the first other conductive portion, an orientation from the first element portion to the first other element portion is a first orientation,
the second element includes a second magnetic element and a second conductive member,
the second magnetic element includes a second magnetic layer and a second opposed magnetic layer,
the second conductive member includes a second conductive portion and a second other conductive portion, a direction from the second conductive portion to the second other conductive portion is along the second direction,
the first resistance includes a first resistance portion and a first other resistance portion, a direction from the first resistance portion to the first other resistance portion is along the second direction,
the second resistance includes a second resistance portion and a second other resistance portion, a direction from the second resistance portion to the second other resistance portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the first element portion is electrically connected to the second circuit,
the first other element portion is electrically connected to the second resistance portion,
the second other resistance portion is electrically connected to the second circuit,
the first resistance portion is electrically connected to the second circuit,
the first other resistance portion is electrically connected to the second element portion,
the second other element portion is electrically connected to the second circuit,
the detection current flows through the first magnetic element in the first orientation, and flows through the second magnetic element in the second orientation, and
when the first current flows through the first conductive member in the first orientation, the first current flows through the second conductive member in the second orientation.

9. The sensor according to claim 5, wherein
the element portion further includes
a second element,
a third element, and
a fourth element,
the first magnetic element includes a first element portion and a first other element portion, the first element portion corresponds to the first conductive portion, the first other element portion corresponds to the first other conductive portion, an orientation from the first element portion to the first other element portion is a first orientation,
the second element includes a second magnetic element and a second conductive member,
the second magnetic element includes a second magnetic layer and a second opposed magnetic layer,
the second conductive member includes a second conductive portion and a second other conductive portion, the direction from the second conductive portion to the second other conductive portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the third element includes a third magnetic element and a third conductive member,
the third magnetic element includes a third magnetic layer and a third opposed magnetic layer,
the third conductive member includes a third conductive portion and a third other conductive portion, a direction from the third conductive portion to the third other conductive portion is along the second direction,
the third magnetic element includes a third element portion and a third other element portion, the third element portion corresponds to the third conductive portion, the third other element portion corresponds to the third other conductive portion, an orientation from the third element portion to the third other element portion is a third orientation, the fourth element includes a fourth magnetic element and a fourth conductive member, the fourth magnetic element includes a fourth magnetic layer and a fourth opposed magnetic layer, the fourth conductive member includes a fourth conductive portion and a fourth other conductive portion, a direction from the fourth conductive portion to the fourth other conductive portion is along the second direction, the fourth magnetic element includes a fourth element portion and a fourth other element portion, the fourth element portion corresponds to the fourth conductive portion, the fourth other element portion corresponds to the fourth other conductive portion, an orientation from the fourth element portion to the fourth other element portion is a fourth orientation, the first element portion is electrically connected to the second circuit, the first other element portion is electrically connected to the second element portion, the second other element portion is electrically connected to the second circuit, the third element portion is electrically connected to the second circuit, the third other element portion is electrically connected to the fourth element portion, the fourth other element portion is electrically connected to the second circuit, the detection current flows through the first magnetic element in the first orientation, flows through the second magnetic element in the second orientation, flows through the third magnetic element in the third orientation, and flows through the fourth magnetic element in the fourth orientation, when the first current flows through the first conductive member in the first orientation, the first current flows through the second conductive member in an opposite orientation to the second orientation, the first current flows through the third conductive member in an opposite orientation to the third orientation, and the first current flows through the fourth conductive member in the fourth orientation.

10. The sensor according to claim 1, wherein a length of the first magnetic element in the second direction is longer than a length of the first magnetic element in the third direction crossing the plane including the first direction and the second direction.

11. The sensor according to claim 1, wherein when the first current is not flowing, a magnetization of the first magnetic layer is along the second direction, and a magnetization of the first opposed magnetic layer is along the second direction.

12. The sensor according to claim 1, wherein
an absolute value of the local minimum value of the first current is larger than an absolute value of the first current value of the first polarity, in a state where a detection target magnetic field along the second direction is not applied to the first magnetic element, an electric resistance of the first magnetic element when a current having the first current value flows through the first conductive member is 0.9 times a saturated electric resistance, and the saturated electric resistance is a saturation value of the electric resistance of the first magnetic element when a current flowing through the first conductive member increases.

13. The sensor according to claim 1, wherein the first magnetic element includes a first non-magnetic layer provided between the first magnetic layer and the first opposed magnetic layer.

14. The sensor according to claim 1, wherein
the first element includes a first insulating member, and
at least a part of the first insulating member is provided between the first magnetic element and the first conductive member.

15. The sensor according to claim 1, wherein a direction from the first conductive member to the first magnetic element is along the first direction.

16. An inspection device, comprising
the sensor according to claim 1; and
a processer configured to processes an output signal obtained from the sensor.

17. A sensor comprising:
an element portion including a first element, the first element including a first magnetic element, the first magnetic element including a first magnetic layer and a first opposed magnetic layer; and a controller including a magnetic field generating portion, the magnetic field generating portion being configured to generate a first magnetic field along a crossing direction crossing a first direction from the first magnetic layer to the first opposed magnetic layer, the first magnetic field including an AC magnetic field component, a local minimum value of the first magnetic field being of a first polarity, a local maximum value of the first magnetic field being of the first polarity, wherein
an absolute value of the local minimum value of the first magnetic field is larger than an absolute value of a first magnetic field value of the first polarity, in a state where a detection target magnetic field along the second direction is not applied to the first magnetic element, an electric resistance of the first magnetic element when a magnetic field along the crossing direction having the first magnetic field value is applied to the first magnetic element is 0.9 times a saturated electric resistance, and the saturated electric resistance is a saturation value of an electric resistance of the first magnetic element when a magnetic field along the crossing direction increases.

18. The sensor according to claim 17, wherein a first electric resistance of the first magnetic element changes according to a change of the first magnetic field.

* * * * *